US009603239B2

(12) United States Patent
Nishioka et al.

(10) Patent No.: US 9,603,239 B2
(45) Date of Patent: Mar. 21, 2017

(54) TOUCH SCREEN, TOUCH PANEL, DISPLAY DEVICE AND ELECTRONIC DEVICE

(71) Applicant: Mitsubishi Electric Corporation, Tokyo (JP)

(72) Inventors: Takahiro Nishioka, Tokyo (JP); Naoki Nakagawa, Tokyo (JP); Masafumi Agari, Tokyo (JP); Takeshi Ono, Tokyo (JP); Seiichiro Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/378,072

(22) PCT Filed: Feb. 21, 2013

(86) PCT No.: PCT/JP2013/054249
§ 371 (c)(1),
(2) Date: Aug. 11, 2014

(87) PCT Pub. No.: WO2013/133026
PCT Pub. Date: Sep. 12, 2013

(65) Prior Publication Data
US 2015/0002464 A1 Jan. 1, 2015

(30) Foreign Application Priority Data

Mar. 6, 2012 (JP) .................................. 2012-049180
Apr. 19, 2012 (JP) .................................. 2012-095569

(51) Int. Cl.
*G06F 3/044* (2006.01)
*H05K 1/02* (2006.01)
(Continued)

(52) U.S. Cl.
CPC ........... *H05K 1/0274* (2013.01); *G06F 3/044* (2013.01); *H05K 1/0298* (2013.01);
(Continued)

(58) Field of Classification Search
CPC .......... G06F 3/044; G06F 2203/04112; G06F 3/047; G06F 3/0412; G02F 1/13338
See application file for complete search history.

(56) References Cited

U.S. PATENT DOCUMENTS 5,844,506 A * 12/1998 Binstead ............... G06F 3/0202
178/19.01
5,889,236 A * 3/1999 Gillespie ................. G06F 3/041
178/18.01
(Continued)

FOREIGN PATENT DOCUMENTS

CN 101529327 A 9/2009
CN 102016767 A 4/2011
(Continued)

OTHER PUBLICATIONS

Notification of Concerning Transmittal of International Preliminary Report on Patentability and Translation of Written Opinion of the International Searching Authority; PCT/JP2013/054249 issued on Sep. 18, 2014.
(Continued)

*Primary Examiner* — Michael J Eurice
(74) *Attorney, Agent, or Firm* — Studebaker & Brackett PC

(57) ABSTRACT

Detection column wires and detection row wires are configured of thin wires made of a conductive material having light reflectivity, such as a metal or alloy including silver and aluminum. A predetermined plural number of detection column wires are electrically connected to form a plurality of column-direction bundle wires. A predetermined plural number of detection row wires are electrically connected to form a plurality of row-direction bundle wires. A reflected-light distribution pattern is further provided. When viewed in a direction vertical to the surface of the touch screen, the
(Continued)

reflected-light distribution pattern includes a curved portion, and the normal lines of the curved portion head for all directions.

11 Claims, 19 Drawing Sheets

(51) Int. Cl.
    *G06F 3/047*           (2006.01)
    *G02F 1/1333*        (2006.01)
    *G06F 3/041*           (2006.01)

(52) U.S. Cl.
    CPC .......... *G02F 1/13338* (2013.01); *G06F 3/047* (2013.01); *G06F 3/0412* (2013.01); *G06F 2203/04112* (2013.01); *H05K 2201/0302* (2013.01); *H05K 2201/10128* (2013.01); *H05K 2201/10151* (2013.01)

(56) References Cited

U.S. PATENT DOCUMENTS

| | | | | |
|---|---|---|---|---|
| 6,137,427 | A * | 10/2000 | Binstead | G06F 3/0202 341/33 |
| 7,202,859 | B1 | 4/2007 | Speck et al. | |
| RE40,867 | E | 8/2009 | Binstead | |
| 8,269,744 | B2 | 9/2012 | Agari et al. | |
| 8,390,598 | B2 | 3/2013 | Agari et al. | |
| 8,550,991 | B2 * | 10/2013 | Nam | G06F 3/044 29/825 |
| 2004/0229028 | A1 * | 11/2004 | Sasaki | C03C 17/10 428/220 |
| 2006/0127605 | A1 * | 6/2006 | Takeda | G02B 5/3016 428/1.3 |
| 2007/0074914 | A1 * | 4/2007 | Geaghan | G06F 3/044 178/18.06 |
| 2008/0211371 | A1 * | 9/2008 | Sasaki | H05K 3/106 313/112 |
| 2009/0073085 | A1 * | 3/2009 | Saneto | H05K 9/0096 345/36 |
| 2009/0219257 | A1 * | 9/2009 | Frey | G06F 3/044 345/173 |
| 2010/0045615 | A1 * | 2/2010 | Gray | G06F 3/044 345/173 |
| 2010/0060596 | A1 * | 3/2010 | Whight | G06F 3/044 345/173 |
| 2010/0060602 | A1 * | 3/2010 | Agari | G06F 3/044 345/173 |
| 2010/0156840 | A1 * | 6/2010 | Frey | G06F 3/044 345/174 |
| 2010/0200286 | A1 * | 8/2010 | Melcher | G02F 1/155 174/261 |
| 2010/0253647 | A1 * | 10/2010 | Agari | G06F 3/044 345/174 |
| 2010/0302201 | A1 * | 12/2010 | Ritter | G06F 3/044 345/174 |
| 2011/0290631 | A1 * | 12/2011 | Kuriki | G06F 3/044 200/600 |
| 2012/0056664 | A1 * | 3/2012 | Nam | G06F 3/044 327/517 |
| 2012/0194481 | A1 | 8/2012 | Frey et al. | |
| 2012/0312677 | A1 * | 12/2012 | Kuriki | G06F 3/044 200/600 |

FOREIGN PATENT DOCUMENTS

| | | |
|---|---|---|
| CN | 102362245 A | 2/2012 |
| JP | H09-511086 A | 11/1997 |
| JP | 2010-061502 A | 3/2010 |
| JP | 2010-097536 A | 4/2010 |
| JP | 2010-108877 A | 5/2010 |
| JP | 2011-150502 A | 8/2011 |
| JP | 2012-519897 A | 8/2012 |
| WO | 95/27334 A1 | 10/1995 |
| WO | 2008/020141 A1 | 2/2008 |

OTHER PUBLICATIONS

International Search Report; PCT/JP2013/054249; Apr. 9, 2013.
A Chinese Office Action issued by Chinese Patent Office on May 16, 2016, which corresponds to Chinese Patent Application No. 201380013208.0 and is related to U.S Appl. No. 14/378,072; with English language translation.

* cited by examiner

F I G . 1
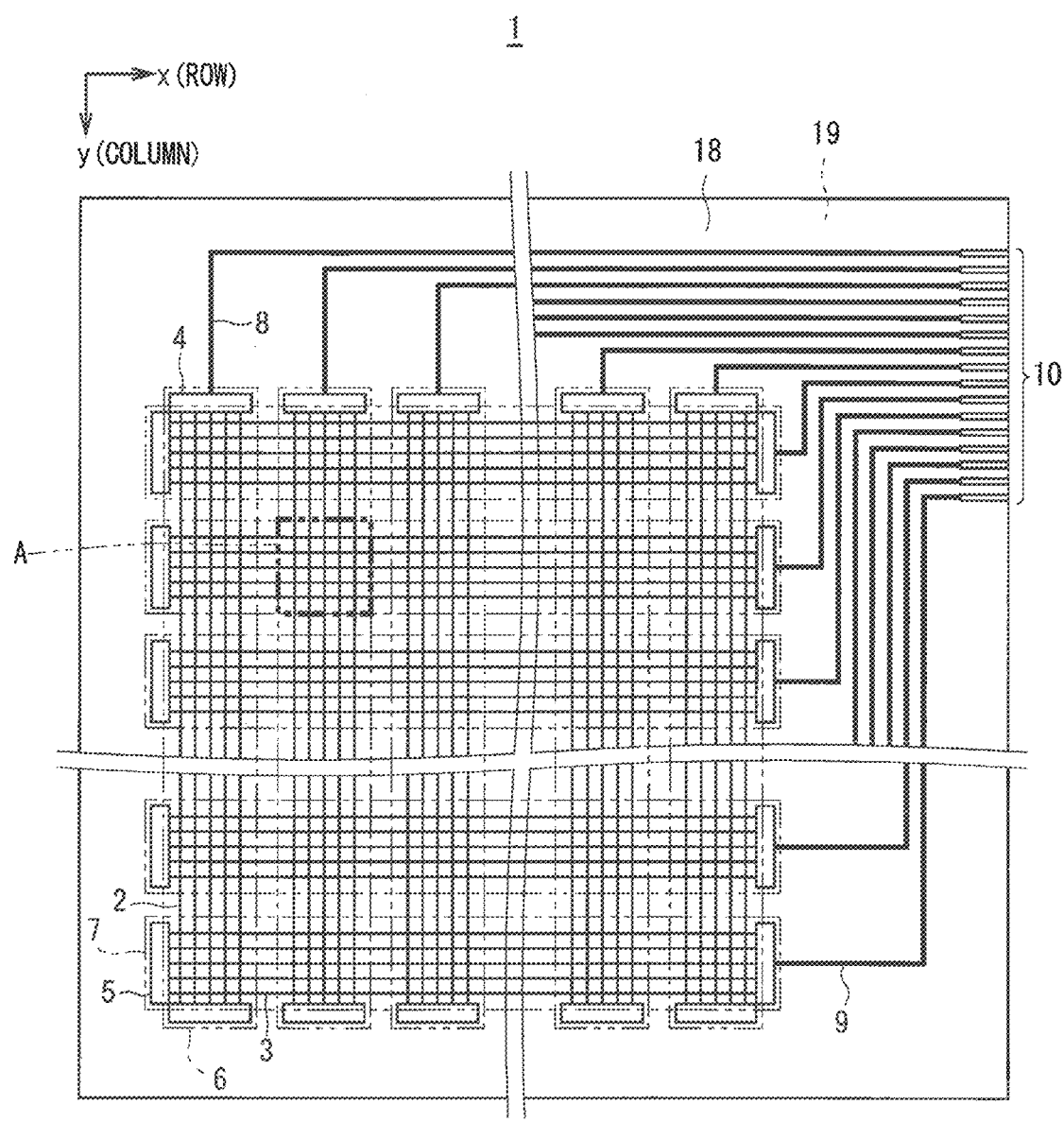

F I G. 2
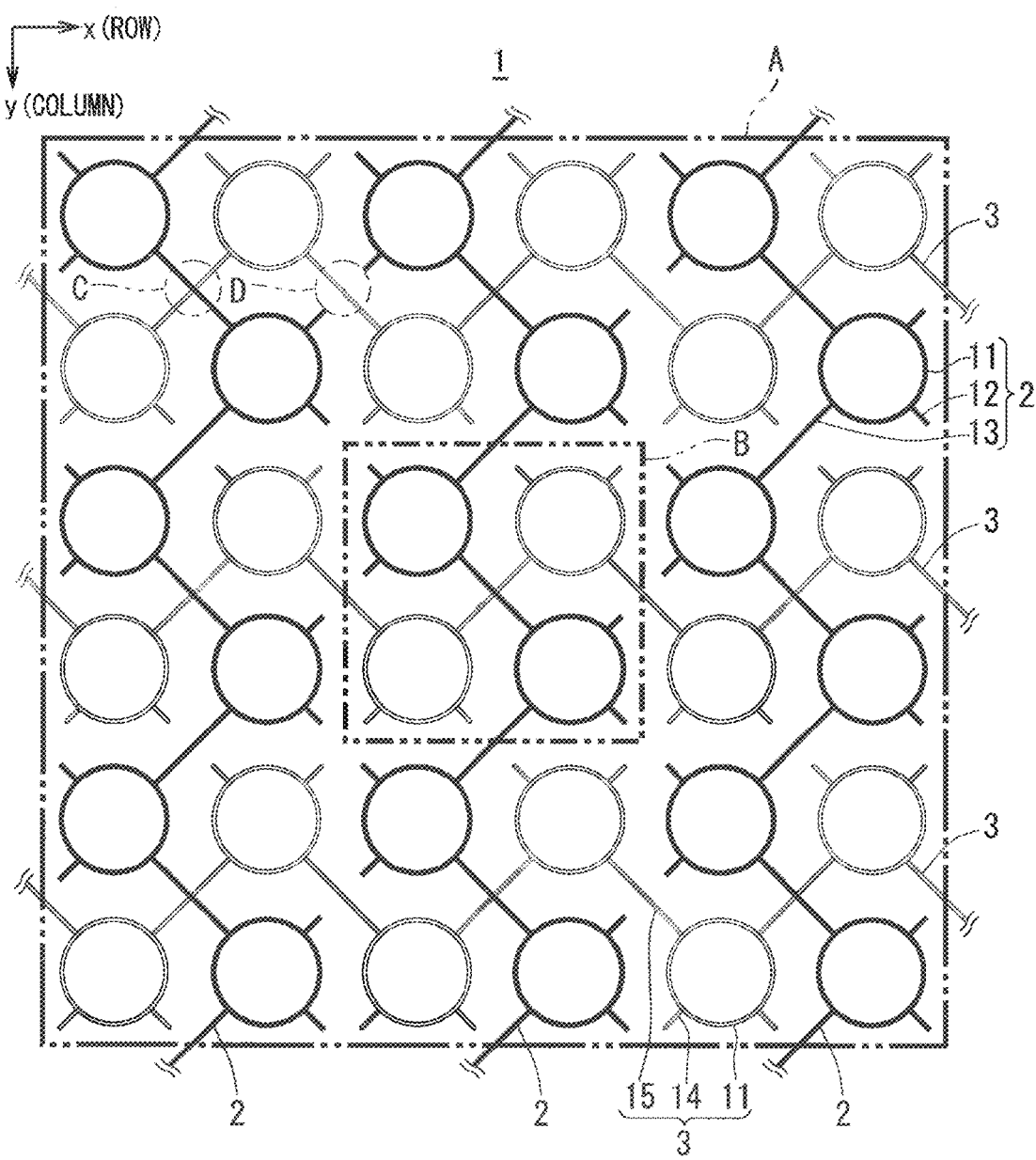
F I G. 3
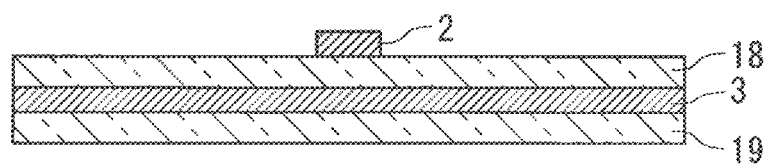

F I G. 8
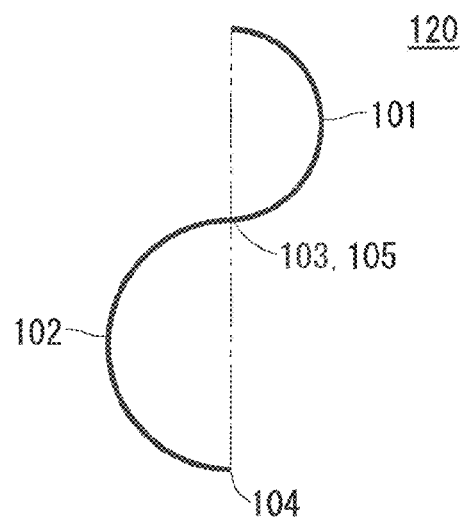
F I G. 9
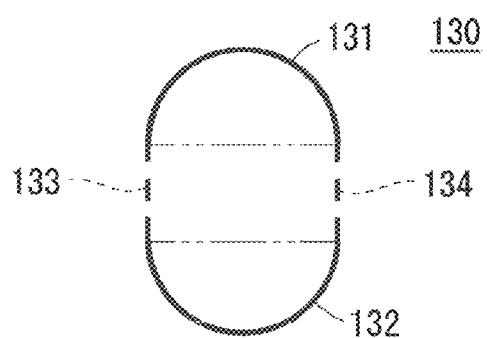
F I G. 10
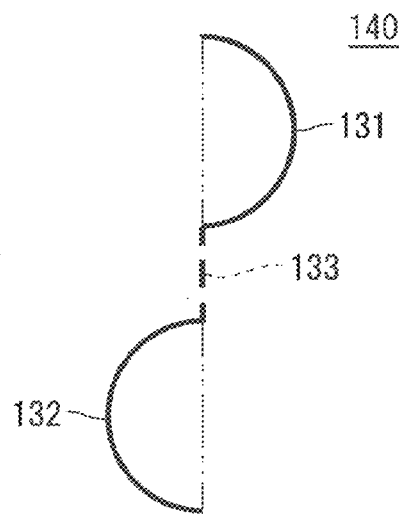

F I G . 1 7
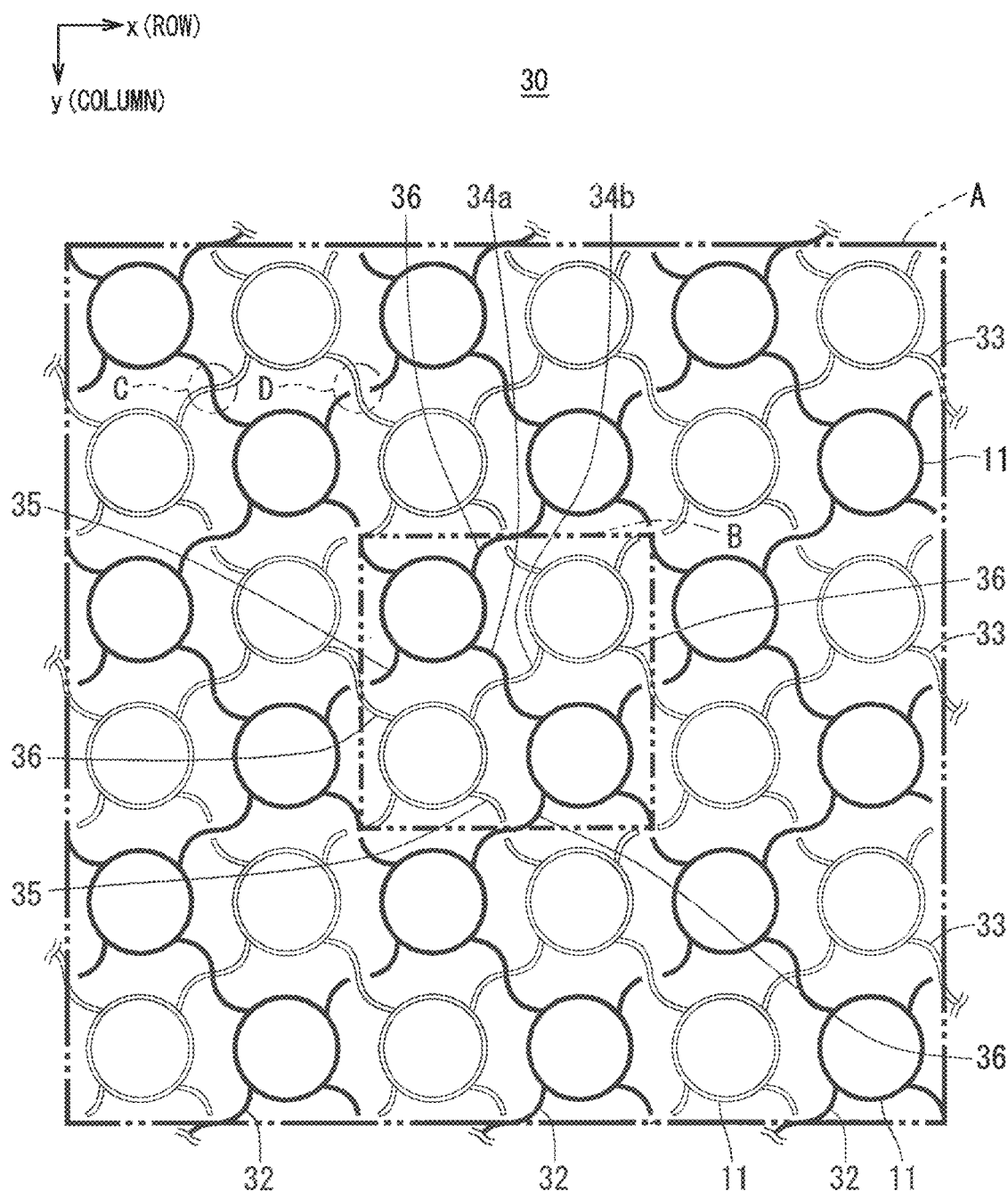

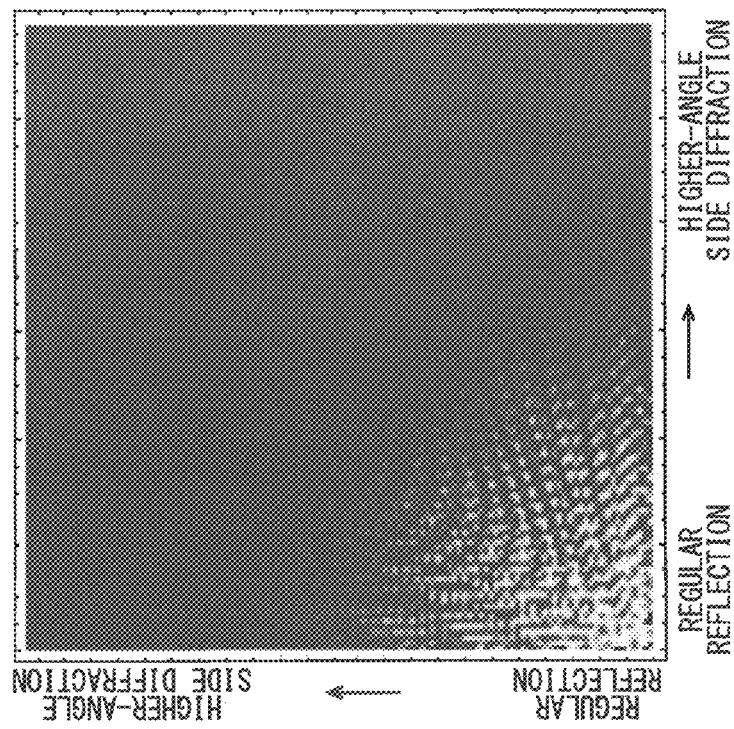
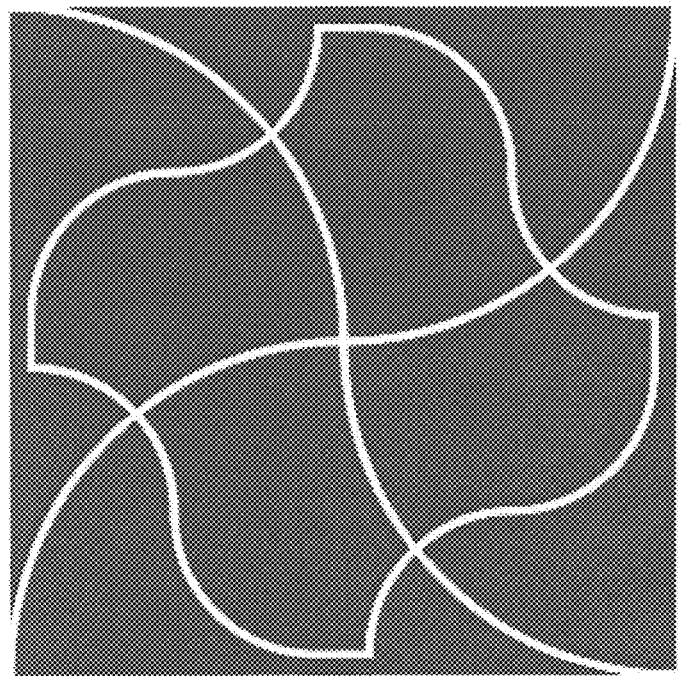
FIG. 25

F I G . 2 6
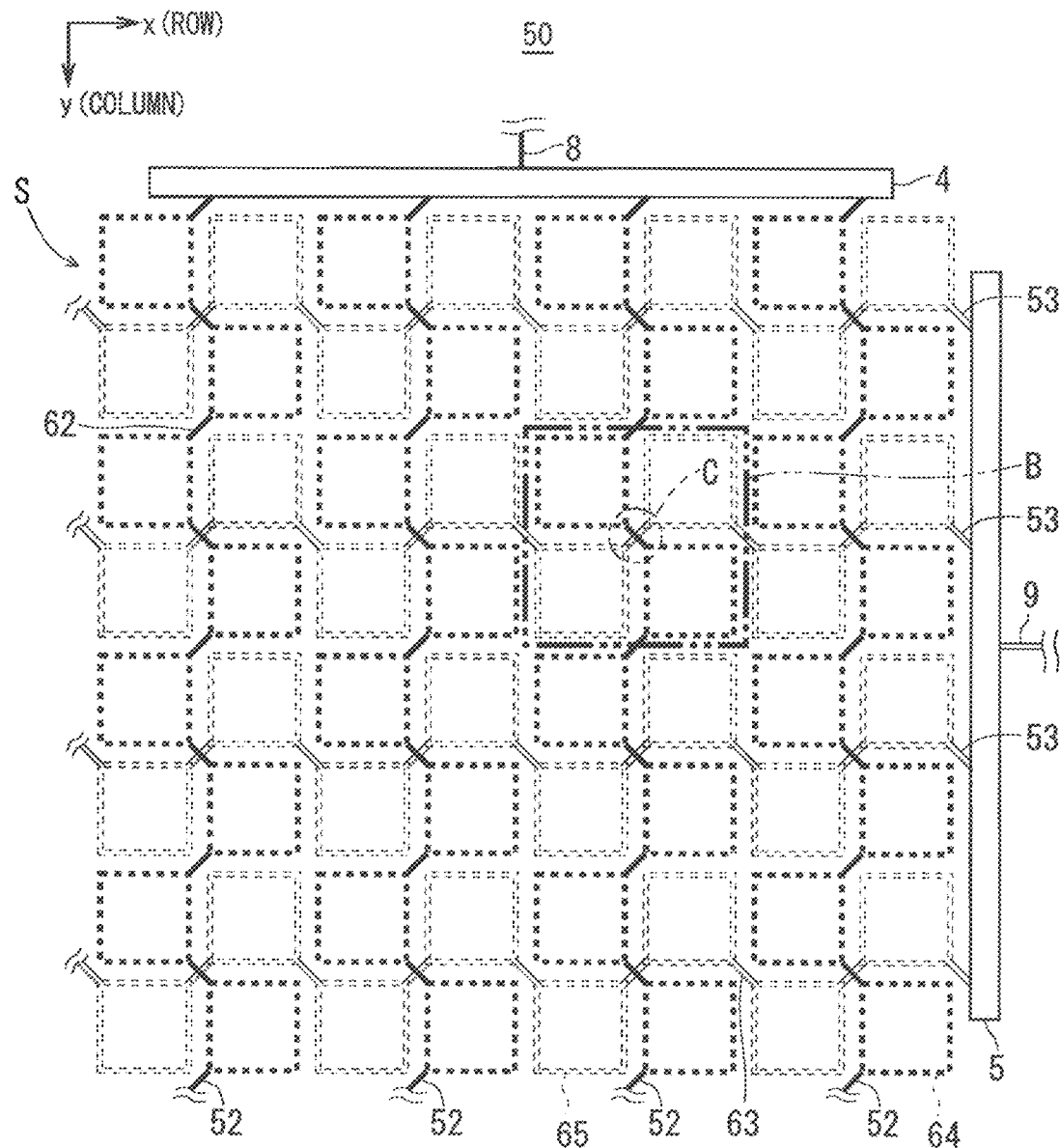

TOUCH SCREEN, TOUCH PANEL, DISPLAY DEVICE AND ELECTRONIC DEVICE

TECHNICAL FIELD

The present invention relates to a touch screen, a touch panel, a display device, and an electronic device.

BACKGROUND ART

Touch panels have been widely known as a device for detecting and outputting the position on a touch screen, which is indicated by an indicator such as a user's finger or a pen (hereinafter may be referred to as "touch position"). A plurality of detection methods for detecting the touch position in the touch panel have been known. Examples of capacitive touch panels include a projected capacitive touch panel.

The projected capacitive touch panel can detect the touch position even when a surface of the touch screen on the side of the user (hereinafter may be referred to as "front surface") is covered with a protective plate such as a glass plate having a thickness of about a few mm. The projected capacitive touch panel has the protective plate disposed on the front surface and has no movable part, and therefore, is advantageously robust and has a long life.

The touch screen of the projected capacitive touch panel is configured of detection column wires for detecting a coordinate of the touch position in the column direction and detection row wires for detecting a coordinate of the touch position in the row direction (for example, refer to Patent Document 1). In following description, the detection column wires and the detection row wires may be collectively referred to as "detection wires".

Patent Document 1 discloses a touch pad system corresponding to the touch panel. The touch pad system disclosed in Patent Document 1 includes, as detection wires for detecting an electrostatic capacitance (hereinafter may be referred to as merely "capacitance"), a first series of conductive elements formed on a thin dielectric film and a second series of conductive elements formed above the first series of conductive elements via an insulating film. There is no electrical contact between the conductive elements, and when viewed in the normal line direction from the front surface, crossed portions where the first series of conductive elements overlap the second series of conductive elements without electrical contact are formed.

By detecting a capacitance formed between an indicator such as a finger and the conductive elements that are the detection wires (hereinafter may be referred to as "touch capacitance") by use of a detection circuit, coordinates of the touch position of an indicator are identified. Relative values of detection capacitances of one or more conductive elements can interpolate the touch position between the conductive elements.

In following description, a member in which the detection column wires and the detection row wires are disposed on a transparent dielectric substrate is referred to as "touch screen", and a device in which a detection circuit is connected to the touch screen is referred to as "touch panel". A region where the touch position can be detected on the touch screen is referred to as "operational region".

To thoroughly detect the touch position of the indicator in the operational region of the touch screen, the detection wires need to be densely disposed in the operational region. To densely dispose the detection wires in the operational region, it is required to avoid the problem that the detection wires may be viewable to the user.

When the detection wires are formed of transparent conducting films such as indium tin oxides (abbreviated as ITO), for example, the detection wires are unlikely to be viewable to the user. However, the transparent conducting film such as ITO have a relatively high electric resistance (hereinafter may be referred to as merely "resistance"), which is disadvantageous to increase the size of the touch screen. Further, since the transparent conducting film such as ITO has a relatively low optical transmittance (hereinafter may be referred to as merely "transmittance"), when the touch screen is illuminated from the back surface side, that is, the opposite side to the user, during use in a liquid crystal display (abbreviated as LCD) or the like, a relatively large amount of light is needed, which is disadvantageous to reduce power consumption.

The detection wires may be also made of metal having a low resistance, such as silver and aluminum. Although the resistance of the detection wires can be decreased by using wires made of metal (hereinafter may be referred to as "metal wires") as the detection wires, the metal wires are opaque and thus, can be easily viewed. To reduce the visibility of the metal wires and increase the transmittance of the touch screen, the metal wires need to be made thin.

When thinned metal wires are used as the detection wires and are densely disposed in the operational region of the touch screen, a parasitic capacitance between the detection column wires and the detection row wires (hereinafter may be referred to as "inter-wire capacitance") largely increases, causing failures including an increase in wiring delay.

The wiring delay can be somewhat mitigated by decreasing the resistance of the wires. Patent Document 2 discloses a technique of decreasing the resistance of the wires to mitigate the wiring delay.

In a touch screen disclosed in Patent Document 2, detection column wires and detection row wires are linear and thin metal wires arranged in a zigzag manner to reduce both of resistance and inter-wire capacitance.

In the touch screen disclosed in Patent Document 2, the plurality of detection row wires extending substantially in the row direction are electrically connected to form row-direction bundle wires, and the plurality of detection column wires extending substantially in the column direction are electrically connected to form column-direction bundle wires. This enables uniform detection of a touch capacitance including the capacitance between the indicator such as a finger and the detection row wires and the capacitance between the indicator and the detection column wires.

However, in the touch screen disclosed in Patent Document 2, the transmittance locally lowers in the area where the thin metal wires are disposed. Accordingly, when the touch screen is used in combination with a display element disposed opposed to the back surface of the touch screen, uneven luminance and uneven display such as moire occur in a display screen of the display element, and are often viewed as failures to the user. When a picture is placed opposed to the back surface of the touch screen and the touch screen is used as a digitizer or tablet, uneven luminance occurs in the picture, and is often viewed as a failure to the user.

Patent Document 3 discloses a technique of reducing such uneven luminance and uneven display (hereinafter collectively referred to as "uneven display"). In the touch panel disclosed in Patent Document 3, uneven display is reduced by providing independent wires that are not connected to the detection wires in an area surrounded by zigzag detection wires.

PRIOR ART DOCUMENTS

Patent Documents

Patent Document 1: Japanese Unexamined Patent Application Publication No. 9-511086 (1997)
Patent Document 2: Japanese Patent Application Laid-Open No. 2010-61502
Patent Document 3: Japanese Patent Application Laid-Open No. 2010-97536

SUMMARY OF INVENTION

Problems to be Solved by the Invention

Touch panel is configured to detect the touch position indicated by the user who is viewing a touch screen. To be viewable to the user, the touch screen may be used in the presence of external light.

In this case, when the metal wires are used as in the techniques disclosed in Patent Documents 2 and 3, sufficient visibility may be acquired. Since even the thin metal wires reflect light on their surfaces, when the touch screen is used while illuminated by external light, reflected light of external light is generated by the metal wires. Especially in the situation where external light is sunlight or bulb light, and the touch screen is illuminated by such spot-like light from a certain direction, intense reflected light is generated.

Since the location of the source of external light cannot be often identified, it is difficult to take a measure to reduce reflected light according to the location of the light source. Accordingly, such intense light caused by reflection of external light on the metal wires is viewed by the user, interfering visibility of the display screen or picture on the back surface of the touch screen. In terms of visibility, the techniques disclosed in Patent Documents 2 and 3 are susceptible to improvement.

An object of the present invention is to provide a touch screen that has excellent detection accuracy and display quality, and can achieve outstanding visibility even when illuminated by external light, and a touch panel, a display device, and an electronic device, which are provided with the touch screen.

Means for Solving the Problems

A touch screen according to the present invention includes a plurality of column wires extending in a predetermined column direction, the column wires being arranged at intervals in a row direction crossing the column direction; a plurality of row wires extending in the row direction, the row wires being arranged at intervals in the column direction; and a transparent base made of a translucent material, the transparent base being provided with the column wires and the row wires which are electrically separated from each other and crossing each other in a three-dimensional way, in which the column wires and the row wires are made of a conductive material having light reflectivity, a predetermined plural number of the column wires are electrically connected to form a plurality of column-direction bundle wires, a predetermined plural number of the row wires are electrically connected to form a plurality of row-direction bundle wires, the transparent base is provided with a reflected-light distribution pattern made of a light reflective material, and the reflected-light distribution pattern includes a curved portion shaped in a curved manner when viewed in a direction vertical to a surface of the transparent base facing a user, and is disposed such that normal lines of the curved portion head for all directions.

The touch panel according to the present invention includes the touch screen according to the present invention and a touch position detection circuit for detecting a position on the touch screen, which is indicated by an indicator on the basis of a capacitance formed between the indicator, and the column wires and the row wires of the touch screen.

A display device according to the present invention includes the touch panel according to the present invention and a display element.

An electronic device according to the present invention includes the touch panel according to the present invention and an electronic element for processing an output of the touch position detection circuit of the touch panel as an input signal.

Effects of the Invention

In the touch screen according to the present invention, since the normal lines of the curved portion of the reflected-light distribution pattern head for all directions, intense reflected light in the specific direction, which is caused when illuminated by spot-like external light can be made invisible.

Since a predetermined plural number of the column wires are electrically connected to form a plurality of column-direction bundle wires and a predetermined plural number of the row wires are electrically connected to form a plurality of row-direction bundle wires, effect of broken line can be suppressed. Further, since a gap is provided in the bundle wires, a decrease in the luminance of an image or picture on the back surface of the touch screen can be prevented. Further, since the reflected-light distribution pattern includes the curved portion, the density of wires including the column wires and the row wires can be increased while ensuring a large distance between the column wires and the row wires, thereby reducing uneven display. Since this can suppress an increase in the inter-wire capacitance that is the parasitic capacitance between the column wires and the row wires, and reduce uneven display, it becomes possible to detect the touch capacitance that is the capacitance formed between the indicator, and the column wires and the row wires uniformly and high-sensitively.

Therefore, a touch screen that has excellent detection accuracy and display quality, and is capable of achieving outstanding visibility even when illuminated by external light can be realized.

A touch panel according to the present invention includes the touch screen that, as described above, has excellent detection accuracy and display quality, and is capable of achieving outstanding visibility even when illuminated by external light. This can realize the touch panel that can be increased in size without decreasing the sensitivity of detecting the touch capacitance.

A display device according to the present invention includes the touch panel provided with the touch screen that, as described above, has excellent accuracy of detecting a touch position and display quality, and is capable of achieving outstanding visibility even when illuminated by external light. Therefore, the display device having outstanding visibility can be realized.

An electronic device according to the present invention includes the touch panel provided with the touch screen that, as described above, has excellent accuracy of detecting a touch position and display quality, and is capable of achieving outstanding visibility even when illuminated by external light. Therefore, the electronic device having outstanding visibility and touch position detection function can be realized.

Objects, features, aspects, and advantages of the present invention will be more apparent by following detailed description and appended drawings.

BRIEF DESCRIPTION OF DRAWINGS

FIG. 1 is a projection view showing configuration of a touch screen 1 in accordance with First embodiment of the present invention.

FIG. 2 is an enlarged projection view showing a region A in FIG. 1.

FIG. 3 is a sectional view showing a configuration of the touch screen 1 in accordance with First embodiment of the present invention.

FIG. 8 is a projection view showing an example of a reflected-light distribution pattern constituted of a non-closed curved thin wire.

FIG. 9 is a projection view showing another example of the reflected-light distribution pattern.

FIG. 10 is a projection view showing another example of the reflected-light distribution pattern.

FIG. 17 is a projection view showing a wiring pattern on a touch screen 30 in accordance with Second embodiment of the present invention.

FIG. 25 is a view showing an example of the wiring basic pattern and the Fourier transform thereof in the vicinity of a DC component.

FIG. 26 is a projection view showing a wiring pattern on a touch screen 50 in accordance with Fifth embodiment of the present invention.

DESCRIPTION OF EMBODIMENTS

First Embodiment

Figure 4:
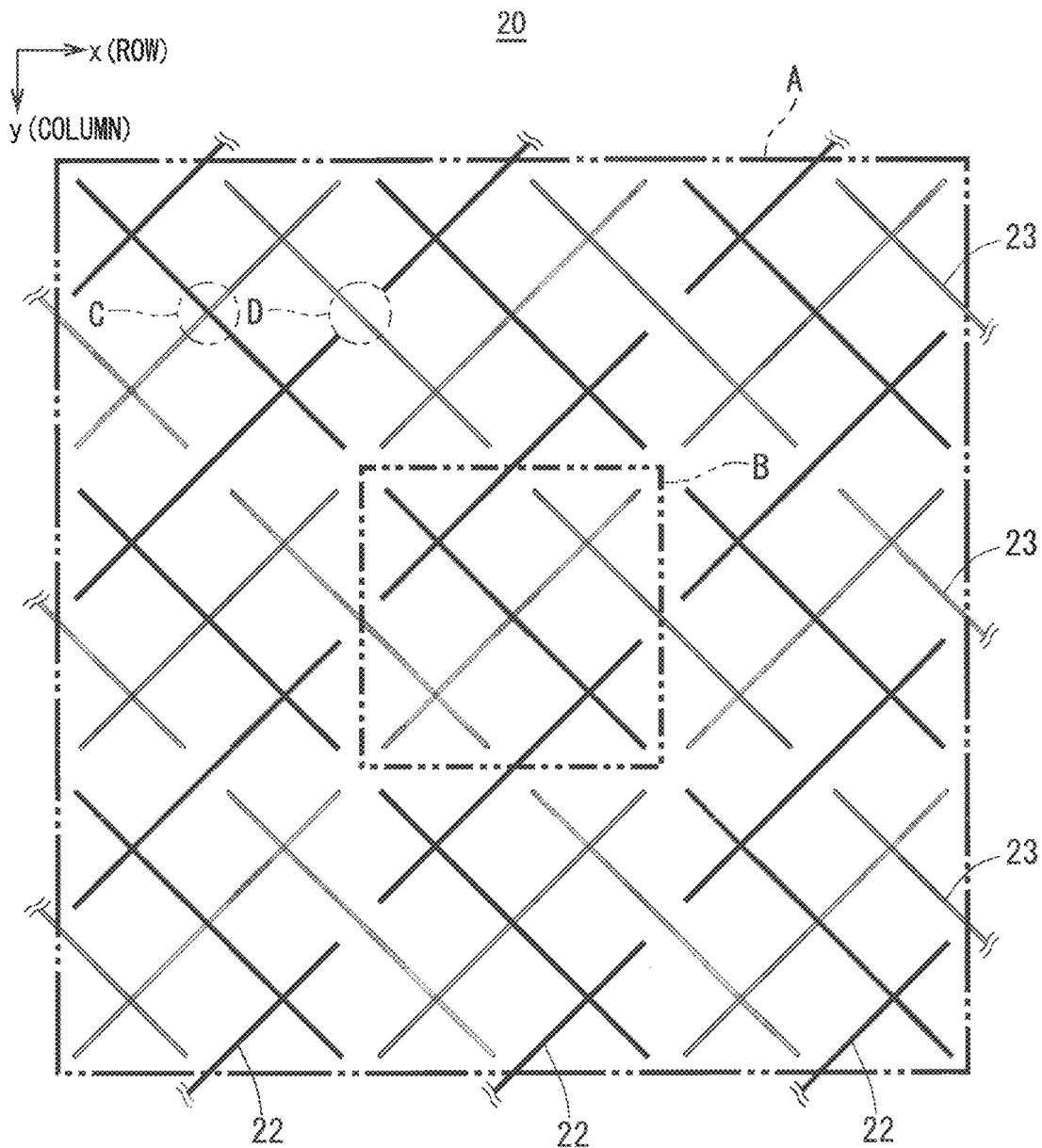
FIG. 4 is a projection view showing a configuration of a touch screen 20 having an inclined cross-shaped wiring pattern.

FIG. 1 is a projection view showing a configuration of a touch screen 1 in accordance with First embodiment of the present invention. FIG. 1 is a projection view when viewed in the direction of a normal line from a front surface side of a transparent base 19. The front surface of the transparent base 19 is a surface facing a user of the transparent base 19, and the direction of the normal line from the front surface of the transparent base 19 is the direction perpendicular to the surface facing the user of the transparent base 19. The "projection view" will be hereinafter referred to a projection view when viewed in such a direction, that is, the direction of the normal line from the front surface side of the transparent base 19. It is assumed that the surface of the transparent base 19, on which detection wires 2 and 3 are disposed is planar. In the case where the surface of the transparent base 19 is curved, projection on a plane perpendicular to the normal line of the surface of the transparent base 19 at a concerned site, that is, a site on which spot-like external light is incident, is considered. FIG. 2 is an enlarged projection view of a region A in FIG. 1. FIG. 3 is a sectional view showing a configuration of the touch screen 1 in accordance with First embodiment of the present invention. FIG. 3 is an enlarged view of a portion where detection column wires 2 and detection row wires 3 cross each other.

The touch screen 1 in this embodiment is a projected capacitive touch screen. The touch screen 1 includes the plurality of detection column wires 2 and the plurality of detection row wires 3. Hereinafter, the detection column wires 2 and the detection row wires 3 may be collectively referred to as "detection wires 2 and 3".

In this embodiment, it is given that the detection column wires 2 and the detection row wires 3 are provided on the front surface of a plate-like or film-like transparent base 19. FIG. 1 corresponds to a view when viewed in the direction of the normal line from the front surface side of the transparent base 19. An insulating layer 18 is interposed between the detection column wires 2 and the detection row wires 3.

The plurality of detection column wires 2 are aligned with a predetermined first pitch consecutively in the row direction, that is, the horizontal direction (x-direction) in FIG. 1. The plurality of detection row wires 3 are aligned with a predetermined second pitch consecutively in the column direction, that is, vertical direction (y-direction) in FIG. 1. In FIG. 1, for convenience of understanding, the detection wires 2 and 3 are linear, however, the detection wires 2 and 3 may have various shapes.

The pitch of the detection wires 2 and 3 is desirably in the range of 0.1 mm to 1 mm. When the pitch of the detection wires 2 and 3 is less than 0.1 mm and too small, the transmittance of the touch screen 1 lowers. When the pitch of the detection wires 2 and 3 exceeds 1 mm and is too large, the pitch of crossed portions of the detection column wires 2 and the detection row wires 3 also becomes large, lowering the detection accuracy of the touch position. Therefore, as described above, the pitch of the detection wires 2 and 3 is desirably in the range of 0.1 mm to 1 mm.

When the pitch of the detection wires 2 and 3 is set to be an integral multiple of a display pixel pitch of a display element such as a liquid crystal display (abbreviated as LCD) as described below, moire tends to occur easily. Accordingly, in the case where the display element disposed or a picture fixedly illustrated on the back surface of the touch screen 1 has a cyclic configuration, it is desired that the pitch of the detection wires 2 and 3 is set to a value other than an integral multiple of the cycle of the cyclic configuration.

The detection wires 2 and 3 are made of a conductive material having light reflectivity. Examples of the conductive material having light reflectivity include a metal such as silver and aluminum and an alloy of such a metal, and conductive oxides such as ITO. The detection wires 2 and 3 may be made of a paste in which the conductive material is dispersed in a resin, for example, a silver paste in which silver is dispersed in a resin.

The expression "having light reflectivity" according to the present invention means that there exists a light incidence angle at which the regular reflectance of a portion where a target material is disposed is larger than the regular reflectance of a portion where the target material is not disposed under the same conditions. As used herein, "regular reflectance" means reflectance estimated using the same incidence angle and reflection angle. The incidence angle and the reflection angle are an angle of incident light and an angle of reflected light in the travelling direction, respectively, and are estimated according to the same definition. Generally, an angle that is formed by the normal line of the surface of a measured object and the light travelling direction, and is expressed in the range of 0 to 90 degrees is used. The reflectance is estimated by luminance reflectance (a value obtained by dividing the luminance of light regularly reflected on the measured object by the luminance of light regularly reflected on any reference surface). In consideration of the visibility of the user, spectral reflectance with an appropriate wavelength, for example, spectral reflectance at a wavelength of 555 nm at which the visibility in a bright place becomes maximum (a value obtained by dividing spectral radiance of light regularly reflected on the measured object by the spectral radiance of light regularly reflected on any reference surface), or spectral reflectance at a wavelength of 507 nm at which the visibility in a dark place becomes maximum may be used. Since the reflectance is obtained by division by the value of the reference surface, in the case where two reflectances are compared as described above, defining the surface of the measured object as the surface of the section where the target material is disposed, and the reference surface as the surface of the section where the target material is not disposed, the comparison can be made by determining whether reflectivity is larger or smaller than 1.

Although the detection wires 2 and 3 have been described to be disposed on the front surface of the transparent base 19, a protective plate or protective film that is made of a transparent dielectric material may additionally be provided on the side of the user, and the detection wires 2 and 3 may be disposed on the back surface of the transparent base 19. This is due to that, even when the protective plate or the like is present between the touch screen and the user, the projected capacitive touch panel can detect the touch position.

In this embodiment, the plurality of detection column wires 2 are divided in a predetermined number of wires to constitute a plurality of bundles of column-direction bundle wires 6. The predetermined number of detection column wires 2 are collectively electrically connected at their one ends and the other ends, that is, their upper ends and lower ends in FIG. 1 by use of a column connecting wire 4 to constitute one bundle of column-direction bundle wires 6. The predetermined number of detection column wires 2 may be connected only at their one ends. The expression "electrically connected" means direct physical connection by use of low resistance (low impedance) wires such as metal wires exemplified above as wires. According to the present invention, connection via a detection circuit is not regarded as electrical connection. That the wires are not electrically connected is expressed as "insulated" or "electrically separated".

Similarly, the plurality of detection row wires 3 are divided in a predetermined number of wires to constitute plural bundles of row-direction bundle wires 7. The predetermined number of detection row wires 3 are collectively electrically connected at their one ends and the other ends, that is, their left ends and right ends in FIG. 1 by use of a row connecting wire 5 to constitute one bundle of row-direction bundle wires 7. The predetermined number of detection row wires 3 may be connected at their one ends. Hereinafter, the column-direction bundle wires 6 and the row-direction bundle wires 7 may be collectively referred to as "bundle wires 6 and 7".

By electrically connecting the predetermined number of detection wires 2 and 3 constituting the bundle wires 6 and 7, respectively, electrical characteristics become uniform among the bundle wires 6 and 7 and therefore, the touch capacitance can be uniformly detected.

This effect can be obtained by increasing wiring area. However, in the case where the opaque material such as metal or a material having an optical reflectivity and a low transmittance is used as the wire material as in this embodiment, wiring portions shield light or the transmittance of the wiring portions lowers. Thus, when the wiring area is increased, the transmittance of the touch screen lowers. The lowering of the transmittance can be suppressed by using thin wires, however, when it is attempted to use the thinnest possible wires to increase the transmittance, the possibility of breakage of the thin wires is raised. In following description, the wire material is an opaque material such as metal.

Thus, in this embodiment, as described above, the plurality of detection wires 2 and 3 are electrically connected to constitute the bundle wires 6 and 7, respectively. Thereby, even if a few detection wires 2 and 3 in the bundle wires 6 and 7 are broken, the touch position can be detected. That is, by using the bundle wires 6 and 7, the disadvantageous breakage of the thin detection wires 2 and 3 can be suppressed to uniformly detect the touch capacitance. Moreover, since gaps having no wire can be provided among the plurality of detection wires 2 and 3 constituting the bundle wires 6 and 7, lowering of the transmittance can be suppressed.

The predetermined number of bundles of the column-direction bundle wires 6 are arranged in parallel in the row direction x. Similarly, the predetermined number of bundles of the row-direction bundle wires 7 are arranged in parallel in the column direction y.

The touch screen 1 is divided into a predetermined number of regions formed by crossed portions of the column-direction bundle wires 6 and the row-direction bundle wires 7. One of the predetermined number of regions is shown as a rectangle represented by reference symbol "A" in FIG. 1. Hereinafter, the region represented by reference symbol "A" may be referred to as "region A". Region A serves as a detection unit for detecting the touch position. The touch position between the regions A is found by interpolation.

In FIG. 1, although the column-direction bundle wires 6 and the row-direction bundle wires 7 each are disposed in a rectangular region to detect the touch position according to the coordinate system along the row direction x and the column direction y, the column-direction bundle wires 6 and the row-direction bundle wires 7 may have other shapes. The column-direction bundle wires 6 and the row-direction bundle wires 7 may be formed of arc-shaped bundle wires and radial bundle wires extending from the center of the arc, for example. The use of these bundle wires enables detection of the touch position according to the polar coordinate system.

The column-direction bundle wires 6 and the row-direction bundle wires 7 are connected to respective terminals 10 via lead wires 8 and 9, respectively. Specifically, the column-direction bundle wires 6 are electrically connected to the respective terminals 10 via the respective column lead wires 8. The row-direction bundle wires 7 are electrically connected to the respective terminals 10 via the respective row lead wires 9.

The crossed portions of the detection column wires 2 and the detection row wires 3 (hereinafter may be referred to as "crossed portions") in FIG. 1 are electrically insulated with each other via the insulating layer 18 when viewed in three dimensions as shown in FIG. 3. The insulating layer 18 may be provided only in the crossed portions of the detection column wires 2 and the detection row wires 3, or may be provided so as to cover the entire detection row wires 3. The insulating layer 18 is desirably made of a transparent dielectric material such as silicon nitride or silicon oxide. In FIG. 3, the detection column wires 2 and the detection row wires 3 may be interchanged.

The transparent base (hereinafter may be referred to as merely "base") 19 is made of a transparent dielectric material. For example, base 19 may be a rigid member such as a glass board, or a flexible member such as a resin film. In this embodiment, the base 19 is a flat rectangular plate. The base 19 may have any shape other than rectangle, and may be curved. When the surface of the transparent base 19 is curved, projection onto the plane perpendicular to a normal line of a surface of the transparent base 19 at a concerned site, that is, a site on which spot-like external light is incident is considered.

In the touch screen 1, the region A as the detection unit of the touch position in FIG. 1 contains the column-direction bundle wire 6 and the row-direction bundle wire 7. In this embodiment, as shown in FIG. 2, the column-direction bundle wire 6 is configured of three detection column wires 2, and the row-direction bundle wire 7 is configured of three detection row wires 3. The number of the detection wires 2 or 3 constituting each of the bundle wires 6 or 7 only need to be plural, and may be changed as appropriate. In FIG. 2, for convenience of understanding, although each detection row wire 3 is represented by a double line, each detection row wire 3 is actually formed of one thin wire.

In FIG. 2, a portion that is represented by reference symbol "C" and surrounded with a chain double-dashed line is the crossed portion where the detection column wire 2 and the detection row wire 3 cross each other via the insulating layer 18. A portion that is represented by reference symbol "D" and surrounded with a chain double-dashed line is a portion where the detection column wire 2 is decoupled (hereinafter may be referred to as "decoupled portion"). In the decoupled portion D, the detection column wire 2 and the detection row wire 3 do not cross each other.

The crossed portion C and the decoupled portion D determine the crossed state of the detection wires 2 and 3. In this embodiment, decoupled thin wires 12 and 14 remain in the detection wires 2 and 3. Linear portions 13 and 15 of the detection wires 2 and 3 extend at an angle of ±45 degrees in the row direction x and the column direction y. Thus, when the touch screen 1 is used in combination with a display device having rectangular pixels formed of sides parallel to the row direction x and the column direction y in FIG. 1, paper having ruled lines such as graph paper, or a plate surface, moire hardly occurs.

The arrangement pattern of the detection wires 2 and 3 in FIG. 2 (hereinafter may be referred to as "wiring pattern") is an example, the wiring pattern is not limited to this, and may be other wiring patterns.

As shown in FIG. 2, the wiring pattern that is the arrangement pattern of the detection wires 2 and 3 is configured by repeatedly placing a certain basic pattern over the operational region. With this configuration, the uniformity of the detection accuracy of the touch position in the operational region can be improved. The "operational region" used herein means a region where the touch position can be detected in the touch screen.

In the example shown in FIG. 2, a rectangular region B surrounded with a chain double-dashed line is the basic pattern. The region B of the rectangular basic pattern can fill the rectangular operational region employed by most touch panels, and is suitable for detecting the touch position in a rectangular coordinate system, which is advantageous. Even when the touch position is detected in other coordinate system, the region as the rectangular basic pattern smaller than the detection accuracy can fill the operational region. A basic pattern having a non-rectangular region may be adopted.

The basic pattern is not limited to the pattern shown in FIG. 2, and may be various patterns. As needed, the basic pattern may be connected with another thin wire.

When a thin wire extending in a certain direction is illuminated with spot-like sunlight or bulb light, intense reflected light occurs in the extending direction from the surface of the thin wire. When such reflected light occurs, the visibility of the display screen or picture on the back surface of the touch screen 1 lowers, giving discomfort including glare to the user.

Especially when a straight line is drawn along the extending direction of a thin wire in the projection view, and the thin wire with a slit is placed on the straight line, the thin wire and the slit act as a reflective diffraction grating, and reflected diffracted light travels in the direction other than that of regular reflection.

FIG. 4 is a projection view showing a configuration of a touch screen 20 having an inclined cross-shaped wiring pattern. For example, in the touch screen 20 shown in FIG. 4, the detection column wires 22 and the detection row wires 23 extend in an inclined cross-shape at an angle of 45 degrees with respect to the row direction x and the column direction y, respectively. In the projection view of FIG. 4, when straight lines are drawn in the inclined cross-shape, most of the detection wires 22, 23 are placed on the inclined cross-shaped straight lines.

When the touch screen 20 is illuminated by spot-like light, a spot image appears with trails in the inclined cross-shape, that is, in the extending directions of the detection wires 22, 23 as if it passes through a cross filter. Accordingly, the visibility is further decreased to give discomfort such as glare to the user.

By contrast, in the wiring pattern in this embodiment, as shown in FIG. 2, the basic pattern in the region B is configured of a linear thin wire portion (hereinafter may be referred to as "linear thin wire") and a curved thin wire (hereinafter may be referred to as "curved thin wire") 11. The curved thin wire corresponds to a curved portion. In this embodiment, the curved thin wire 11 is a circular thin wire. The curved thin wire 11 is referred to as "reflected-light distribution pattern". Detailed definition of the reflected-light distribution pattern will be described later.

When a straight line is drawn from the center of the circle constituting the reflected-light distribution pattern 11, wiring is placed on the straight line drawn in any direction and therefore, reflected light and reflected diffracted light from the reflected-light distribution pattern 11 (hereinafter may be collectively referred to as "reflected light") head for all directions. Accordingly, as compared to the touch screen 20 provided with the wiring pattern having no reflected-light distribution pattern as shown in FIG. 4, the touch screen 1 in this embodiment can reduce the above-mentioned reflected light in the specific directions.

In following description, unless otherwise specified, the projection view when viewed in the direction of the normal line from the front surface side of the transparent base 19 is assumed, and connected wires in the projection view are deemed to be connected. For electrical connection, the term "electrical" is added. Since it is sufficient to examine only the basic pattern in the region B, the wires are considered to be interrupted at edges of the region of the basic pattern.

The "reflected-light distribution pattern" is generally a thin wire that is made of a conductive material having light reflectivity and includes the curved thin wire at least partially when viewing the detection wires 2 and 3 in the projection view, that is, a thin wire having normal lines heading for all directions, such as the circular thin wire 11 shown in FIG. 2.

In this embodiment, the detection wires 2 and 3 including the reflected-light distribution pattern 11 all are thin wires. The reflected-light distribution pattern 11 may not be included in the detection wires, that is, the reflected-light distribution pattern 11 may not be electrically connected to the detection wires 2 and 3 and may be separated. However, the reflected-light distribution pattern 11 should be formed of the thin wire as shown in FIG. 2. Terms such as "width" and "length" as parameters representing the characteristics of the shape of the thin wire will be described below.

In the projection view, a line forming the edge of the thin wire is generally referred to as contour. In the case of one thin wire having a limited length and no bifurcation (hereinafter may be referred to as "branch"), that is, the thin wire having contours that are two opposed (straight or curved) segments, a portion corresponding to a region formed by connecting the two opposed contours to their end points is regarded as one thin wire (wiring formed of the thin wires as shown in FIG. 2 is regarded as consisting of a plurality of thin wires). In the case where the thin wire has a branch, the branch is regarded as another thin wire. The thin wire having two opposed straight contours (curvature is 0, and curvature radius is infinite) is defined as "linear thin wire". The thin wire having at least one curved contour (curvature is not 0) of the two opposed contours is defined as "curved thin wire".

Although described later in more detail, in defining the "thin wire" in detail, given that a typical longitudinal distance of the wire is "length" and a typical lateral distance of the wire is "width", the "thin wire" can be generally said to be a structure in which the width is much smaller than the length. The terms "width" and "length" follow below-mentioned definitions.

The curved thin wire will be described. In the projection view, a point P is taken on the contour having a smaller curvature radius of the two opposed contours of the curved thin wire. An intersection point between a normal line nP that is a straight line orthogonal to a tangent line of the contour at the point P and the other contour is defined as a point Q, and a midpoint between the point P and the point Q is defined as a point R. In the case where there are a plurality of points Q, a point Q closest to the point P is defined as the point Q. A distance between the point P and the point Q is defined as the width of the thin wire.

For the curved thin wire, by thoroughly moving the point P on the curved contour, distribution of width and a segment of the connected midpoints R are acquired. When the segment of the connected midpoints R is discontinuous (discontinuity may occur when the contour on which the point Q is positioned is bent), a series of consecutive line can be acquired by connecting two end points of discontinuous sections by using a part of the line on which the point R is positioned by interpolation using a curved line, such as spline interpolation. The series of consecutive line is defined as a median line of the curved thin wire. A normal line at each point on the median line is defined as a normal line of each point on the curved thin wire. A direction of the tangent line at each point of the median line is defined as an extending direction at each point of the curved thin wire. A length of the median line is defined as a length of the curved portion of the curved thin wire. In the case where the median line has end points, that is, is not closed, the end points of the median line are defined as end points of the curved thin wire.

In the case of the linear thin wire in which both of two opposed contours are straight lines and their both ends are connected to the curved thin wire, at each end of the linear thin wire, the points P are taken on two intersection points between the contour of the curved thin wire which is connected to the linear thin wire and on which the point P is taken, and the contours of the linear thin wire. According to the above-mentioned definition, midpoints R at two end points are found. A straight line of the connected midpoints R at the two end points is defined as the median line of a linear thin wire, a normal line of the median line is defined as a normal line of the linear thin wire, and a direction of the median line is defined as an extending direction of the linear thin wire. The midpoints R at two end points are defined as end points of the linear thin wire that is a part of the thin wire. A distance between the two end points is defined as a length of the linear thin wire. A point R' is taken on the median line of the linear thin wire, and intersection points between the normal line passing the R' and two contours are defined as a point P' and a point Q'. A distance between the point P' and the point Q' is defined as a width, and distribution of the width can be acquired by thoroughly moving the point R' on the median line.

In the case where the curved thin wire is connected to an end connected to some linear thin wires, first, for the linear thin wires connected to the curved thin wire, a point P is taken at the other end of the contour of the linear thin wire connected to the contour of the curved portion of the thin wire on which the point P is placed, and the median line and the width are acquired according to the procedure. For the linear thin wire connected to the linear thin wire, the "connected curved thin wire" is replaced with "the connected linear thin wire at which the point P is taken", the median line and the width are acquired according to the same procedure.

Since the reflected-light distribution pattern is a thin wire that is made of a conductive material having light reflectivity and at least partially includes the curved thin wire, in considering the reflected-light distribution pattern, it is not necessary to take into account the thin wire that is not connected to the curved thin wire when considering the reflected-light distribution pattern.

In the case of the thin wire in which the normal lines of the tangent lines at the point P and the point Q are identical and the contours are similar, the median line, width, and length that are acquired according to the above procedure correspond to general terms. That is, the distance between two intersection points on the contours with the normal line is width, and the width is uniform on the thin wire, that is, equal. A line connecting midpoints of the two intersection points is a median line, and a length of the median line is a length of the thin wire.

In the case where the branch thin wire extends from the concerned thin wire, curved lines interpolated from the two intersection points of the concerned thin wire and the contours of the branch thin wire using a part of the contours of the thin wire according to an interpolation method such as spline interpolation are defined as the contours of the concerned thin wire. As used herein, "branch thin wire" refers to a thin wire branched from the noted thin wire. According to the interpolation method, desirably, at an end of the section to be interpolated, the original contour not within the section and at least two second order differential are consecutive. Using this curved contour, for the part where the branch thin wire extends, the width, median line, normal line of the thin wire are acquired according to the same procedure as described above.

According to the above-mentioned procedure, the width, the median line, the normal line, and the length of the curved thin wire and the linear thin wire that are portions of the thin wire can be acquired. When the median line of the thin wire is not closed, end points can be found.

Which thin wire is the branch thin wire can be freely selected. To describe a requirement that the thin wire is the reflected-light distribution pattern, in the case where a plurality of curved or linear thin wires are connected, thin wires other than any one curved or linear thin wire are defined as branch thin wires, and the one selected thin wire is assumed to be connected to determine whether or not the below-mentioned curved thin wire is the reflected-light distribution pattern.

Whether or not the thin wire is connected is determined in the projection view. For example, the portion that is appears to be connected in the projection view, for example, the crossed portion where the detection column wire 2 and the detection row wire 3 cross each other via the insulating layer 18, which is represented by reference symbol "C" in FIG. 2, is regarded to be connected.

In this embodiment, a thin wire that satisfies a following requirement in the thin wires in the basic pattern of wiring is defined as the reflected-light distribution pattern. Any curved thin wire in the basic pattern of wiring is selected, a curved or linear thin wire connected to the selected thin wire, if any, is selected, and a further connected thin wire, if any, is selected (connected but unselected thin wire is regarded as the branch thin wire), which is repeated in this manner. When the normal lines of the selected thin wire head for all directions, the selected a plurality of (or one) thin wires are defined as candidates for the reflected-light distribution pattern. As used herein, "direction angle" refers to a direction angle in the projection view. Candidates are selected in the order of specific cases (a) to (d) described later, and in the case where a plurality of candidates can be selected in the higher order cases in any of (a) to (c), the candidate having the smallest sum of lengths of the thin wires is defined as the reflected-light distribution pattern, and in the case (d), the candidate having the smallest number of end points is defined as the reflected-light distribution pattern, and when the number of end points is the same, the candidate having the smallest sum of distances between the end points of the thin wires is defined as the reflected-light distribution pattern.

By omitting the thin wire once determined as the reflected-light distribution pattern and repeating candidate selection and reflected-light distribution pattern qualification according to the above-mentioned procedure, all reflected-light distribution patterns in the basic pattern of wiring can be selected without duplicate counting of the thin wire as the reflected-light distribution pattern.

The projection view has defined as a view when viewed in the direction of the normal line from the front surface of the transparent base 19, that is, a view projected to the surface vertical to the normal line. However, when the above-mentioned requirement is met on the projected surface, even the projection view to any surface that is not parallel to the surface is allowable as long as the new surface is not vertical to the original surface. For example, a circular thin wire projected to another non-parallel surface in the projection view appears as an ellipse, but the normal lines still head for all directions. Accordingly, the requirement only needs to be met in the projection view used in the above description, that is, the view when viewed in the direction from the normal line of the front surface of the transparent base 19 facing the user. However, in most cases, the front surface of the transparent base 19, the surfaces of the detection wires 2 and 3, the surface of the thin wire constituting the reflected-light distribution pattern are substantially parallel and thus, to understand reflected light, it is advantageous to select the projected surface parallel to the front surface of the transparent base 19. Even when the transparent base 19 is curved, if the curvature radius is large, it can be approximated to light reflection from the surface parallel to the normal line.

Specific cases where the requirement that the normal lines of the selected thin wire head for all directions are following cases (a) to (d). To determine whether or not the thin wire is the reflected-light distribution pattern, the thin wire is examined for the case (a), and for the case (b), the case (c), and the case (d) in this order.

(a) A case where the median line of any selected curved thin wire is wholly curved except for any smoothly connected straight line (hereinafter may be referred to merely as "median line is curved") and the entire median line is a closed curved line. In this case, the normal lines of the closed curved line head for all directions and therefore, the curved line is the reflected-light distribution pattern.

For example, since the median line of the circular thin wire 11 in FIG. 2 is arcuate, the circular thin wire 11 is the reflected-light distribution pattern according to the definition. The reflected-light distribution pattern is not limited to be circular, and may be elliptic, oval, and gourd-shaped in which the median line is a closed curved line.

Figure 5:
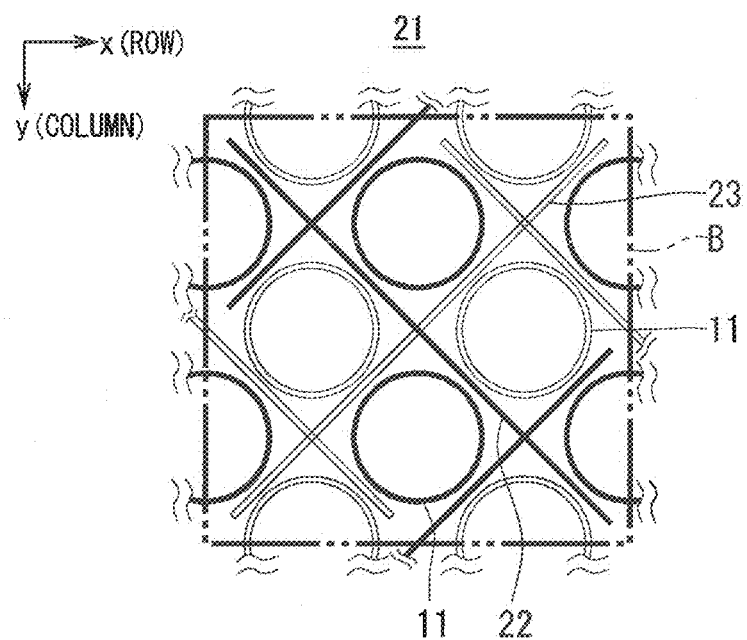
FIG. 5 is a projection view showing another example of the reflected-light distribution pattern.

FIG. 5 is a projection view showing another example of the reflected-light distribution pattern. In FIG. 2, the circular thin wire 11 that is the reflected-light distribution pattern also serves as at least one of the detection column wire 2 and the detection row wire 3, while in the wiring pattern of a touch screen 21 in the FIG. 5, the circular thin wire 11 is electrically insulated from the detection wires 22, 23. In this manner, the detection wires 22, 23 may be electrically insulated from the reflected-light distribution pattern 11. Also in this case, the reflected-light distribution pattern 11 may have the branch thin wire.

Figure 6:
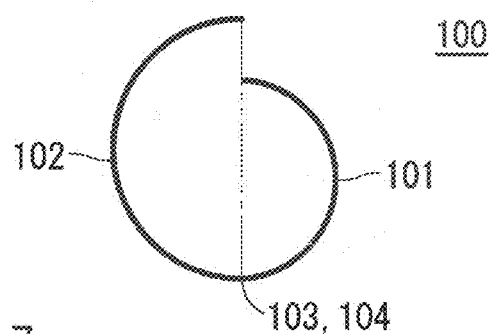
FIG. 6 is a projection view showing an example of a reflected-light distribution pattern constituted of a non-closed curved thin wire.
Figure 7:
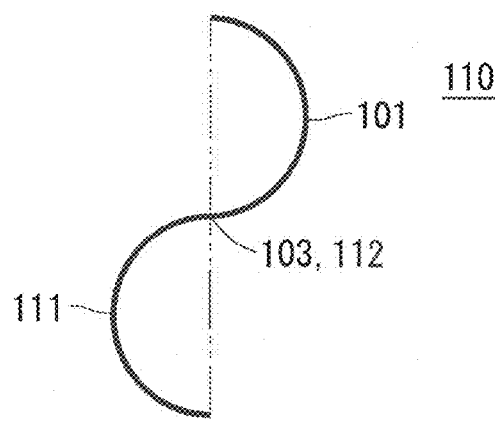
FIG. 7 is a projection view showing an example of a reflected-light distribution pattern constituted of a non-closed curved thin wire.

(b) A case where the median line of any selected curved thin wire is curved, the entire median line is not closed, but the normal lines head for all directions. FIG. 6 to FIG. 8 are projection views showing examples of the reflected-light distribution pattern constituted of a non-closed curved thin wire. In FIG. 6 to FIG. 8, for convenience of understanding, the thin wire constituting the reflected-light distribution pattern is expressed by a thick solid line. FIG. 6 to FIG. 8 show the examples.

In a reflected-light distribution pattern 100 in FIG. 6, two semicircles having different radii are the median line, and tangent lines of two arcuate portions 101 and 102 having concentric contours and a central angle of 180 degrees (hereinafter may be referred to merely as "semicircular") are connected consecutively and smoothly at one ends 103 and 104 to form a non-closed "6-shaped" thin wire.

In a reflected-light distribution pattern 110 in FIG. 7, two semi-circular portions 101 and 111 having the same radius are connected at one ends 103 and 112 to form an S-shaped thin wire.

A reflected-light distribution pattern 120 in FIG. 8, two semi-circular portions 101 and 102 having different radii are connected at one ends 103 and 105 to form an S-shape.

The repeated arrangement of the reflected-light distribution patterns 100 and 120 in FIG. 6 and FIG. 8 causes an asymmetrical shape. Thus, when these reflected-light distribution patterns 100 and 120 are used, it is desired to include mirror reversed reflected-light distribution patterns 100 and 120 in the region B of the wiring basic pattern.

FIG. 6 and FIG. 8 illustrate the reflected-light distribution patterns 100 and 120 each configured of a composite curve formed of two arcs that have the central angle of 180 degrees and have different radii, however, the central angle of the arcs forming the composite curve constituting the reflected-light distribution pattern is not limited to 180 degrees. That is, the reflected-light distribution pattern may be configured of a composite curve formed of a plurality of arcs having different radii. In this case, the reflected-light distribution pattern is disposed in the region B of the basic pattern such that the normal lines of each arc forming the composite curve head for all directions.

In other words, the reflected-light distribution pattern is configured of a composite curve formed of a plurality of arcs having different radii, specifically, formed of n arcs having first to nth radii R1, R2, ..., Rn (n is an integer of 1 or greater), and may be disposed in the region B of the basic pattern such that the normal lines of the arc having the first radius R1 head for all directions and similarly, the normal lines of each of the arcs having the second to nth radii R2, R3, ..., Rn head for all directions. Specifically, the plurality of arcs are consecutively connected to form the composite curve. That is, one end of a certain arc is connected to the other end of another arc to form the composite curve.

As shown in FIG. 6 and FIG. 8, in the reflected-light distribution patterns 100 and 120 each configured of the composite curve formed of the plurality of arcs 101 and 102, the arcs 101 and 102 correspond to the curved portions, and the radii of the arcs 101 and 102 correspond to the curvature radii of the curved portions. Accordingly, in other words, the reflected-light distribution patterns 100 and 120 may be configured of the composite curve formed of the plurality of curved portions 101 and 102 having different curvature radii, and may be disposed such that the normal lines of the curved portions 101 and 102 head for all directions. Specifically, the plurality of curved portions are consecutively connected to form the composite curve. That is, one end of each curved portion is connected to the other end of another curved portion to form the composite curve.

By providing such reflected-light distribution patterns 100 and 120, it is possible to prevent the visibility from lowering due to reflected light and uneven display. Further, it is possible to prevent degradation of electrical characteristics such as an increase in the inter-wire capacitance, enabling uniform and highly-sensitive detection of the touch capacitance. Therefore, a touch screen that has outstanding detection accuracy and display quality and can achieve good visibility even when illuminated by external light can be realized.

The reflected-light distribution patterns 100, 110, and 120 in FIG. 6 to FIG. 8 may be electrically connected to at least one of the detection column wire 2 and the detection row wire 3, or may be separated. The reflected-light distribution patterns 100, 110, and 120 in FIG. 6 to FIG. 8 may have the branch thin wire.

The reflected-light distribution pattern in the (b) may have other shapes. For example, in the reflected-light distribution patterns 100, 110, and 120 in FIG. 6 to FIG. 8, the semicircular thin wires 101, 102, and 111 may be modified to semi-elliptic or semi-oval thin wires. The shape of the reflected-light distribution pattern is not limited to these, and even when the median line of the thin wire is not closed, as long as the normal lines head for all directions, the thin wire functions as the reflected-light distribution pattern.

(c) The case where any selected curved thin wire is connected to another curved thin wire via the linear thin wire, and the normal lines of all the connected curved thin wires head for all directions. In this case, the curved thin wires and the linear thin wire between the plurality of connected curved thin wires are collectively defined as the reflected-light distribution pattern.

Figure 11:
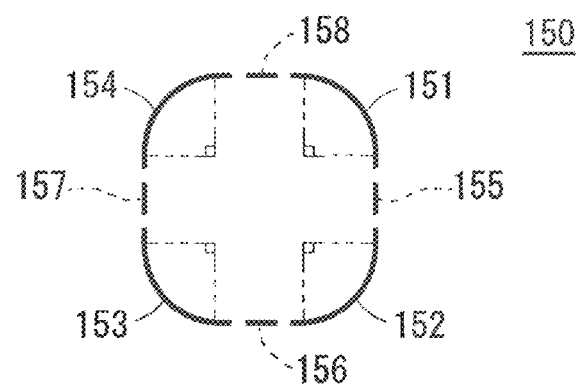
FIG. 11 is a projection view showing another example of the reflected-light distribution pattern.

FIG. 9 to FIG. 11 are projection views showing other examples of the reflected-light distribution pattern. In FIG. 9 to FIG. 11, for convenience of understanding, out of the thin wires constituting the reflected-light distribution pattern, the curved thin wire is expressed by a thick solid line, and the linear thin wire is expressed by a thick broken line.

In a reflected-light distribution pattern 130 in FIG. 9, two semi-circular thin wires 131 and 132 having the same radius are connected to each other via two short linear thin wires 133 and 134 having the same length to form a track shape.

In a reflected-light distribution pattern 140 in FIG. 10, two semi-circular thin wires 131 and 132 having the same radius are connected to each other via one short linear thin wire 133 to form a hook shape.

In a reflected-light distribution pattern 150 in FIG. 11, four thin wires 151 to 154 that have median lines as arcs having a central angle of 90 degrees, concentric contours, and the central angle of 90 degrees (hereinafter referred to as "90 degrees arc") are connected to one another via four short linear thin wires 155 to 158 having the same length to form a rectangle having rounded corners. In following description, the shape having median lines as arcs having a central angle of θ degrees, concentric contours, and a central angle of θ degrees may be referred to as "θ degrees arc". As used herein, θ degrees refer to an angle more than 0 degrees and less than 360 degrees (0 degrees<θ<360 degrees).

The reflected-light distribution patterns 130, 140, and 150 in FIG. 9 to FIG. 11 may be electrically connected to another thin wire, for example, at least one of the detection column wire 2 and the detection row wire 3, or may be separated. The reflected-light distribution patterns 130, 140, and 150 in FIG. 9 to FIG. 11 may have the branch thin wire.

The reflected-light distribution pattern in the (c) may have other shapes. For example, in the reflected-light distribution patterns 130 and 140 in FIG. 9 and FIG. 10, the semi-circular thin wires 131 and 132 may be modified to semielliptical or semioval thin wires. The thin wires 131 and 132 may be shaped like a symbol of infinite "∞" expressing two arcuate thin wires connected to each other via a crossed linear thin wire, or may be a polygon having rounded corners, other than a rectangle. The shape of the reflected-light distribution pattern is not limited to these, and as long as a plurality of curved thin wires are connected to each other via a linear thin wire, and normal lines of all the plurality of connected curved thin wires head for all directions, the thin wires function as the reflected-light distribution pattern.

(d) A case where normal lines of all a plurality of separated curved thin wires in the wiring basic pattern, for example, in the region B, head for all directions. A part of the separated curved thin wires may be connected via a linear thin wire. In the case where there are a plurality of options for thin wire selection, the thin wire of a smaller number of end points among the thin wires has a higher priority. When the number of end points is the same, the thin wire of a smaller distance between the end points has a higher priority. A pair having the smallest distance between two end points is selected, and the pair is omitted and then, a pair having the smallest distance between two end points is selected again. A sum of distances between the end points of the selected pairs is a sum of distances between the end points.

Figure 12:
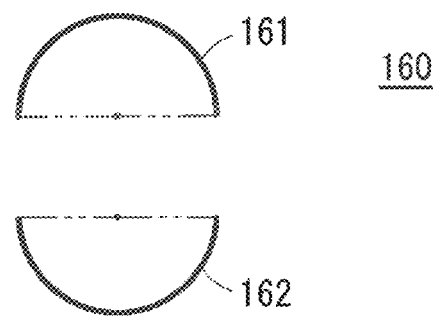
FIG. 12 is a projection view showing another example of the reflected-light distribution pattern.
Figure 13:
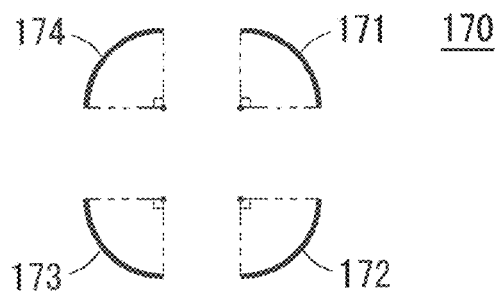
FIG. 13 is a projection view showing another example of the reflected-light distribution pattern.

FIG. 12 and FIG. 13 are projection views showing other examples of the reflected-light distribution pattern. In FIG. 12 and FIG. 13, for convenience of understanding, the thin wire constituting the reflected-light distribution pattern is represented by a thick solid line.

A reflected-light distribution pattern 160 in FIG. 12 is constituted of two semi-circular thin wires 161 and 162 forming a circle together.

A reflected-light distribution pattern 170 in FIG. 13 is constituted of four 90 degrees arc-shaped thin wires 171 to 174 forming a circle together.

At least one of the plurality of curved thin wires 161, 162, and 171 to 174 constituting the reflected-light distribution patterns 160 and 170 in FIG. 12 and FIG. 13 may not be electrically connected to, that is, separated from, another thin wire, for example, the detection wires 2 and 3, and remaining curved thin wires may be electrically connected to another thin wire. The curved thin wires 161, 162, and 171 to 174 constituting the reflected-light distribution patterns 160 and 170 in FIG. 12 and FIG. 13 may have the branch thin wire.

The reflected-light distribution pattern in the (d) may have other shapes. For example, n arc-shaped thin wires each having a central angle of $g_1, g_2, \ldots, g_n$, (in units of "degrees") and having a sum of the central angles of 360 degrees or more ($g_1+g_2+ \ldots + g_n \geq 360$ degrees) may be disposed to form a circular thin wire. The shape of the reflected-light distribution pattern is not limited to these, and as long as normal lines of all the plurality of curved thin wires head for all directions, the thin wires function as the reflected-light distribution pattern.

When the above-mentioned procedure of selecting the reflected-light distribution pattern is applied to the wiring in the region B in FIG. 2, it is determined that four circular thin wires are selected as the reflected-light distribution pattern in the case (a), and remaining linear thin wires cannot constitute the reflected-light distribution pattern.

As described above, when the thin wire extending in a certain direction is illuminated by spot-like external light such as sunlight or bulb light, intense reflected light occurs from the surface of the thin wire in the extending direction of the thin wire. This reflected light gives discomfort such as glare to the user. Especially when the thin wire extending in a specific direction has a slit in the projection view, because the wiring pattern is repetition of the basic pattern, the thin wire serves as a reflective diffraction grating, and reflected diffracted light travels in directions other than regular reflection. For example, when the cross-shaped wires are provided, the user views cross-shaped reflected light as if it passes through a cross filter, resulting in less visibility and more discomfort.

Functions required for the reflected-light distribution pattern are that such intense reflected light only in the specific direction is prevented, in other words, reflected light is made less noticeable when the user views the touch screen. A qualitative requirement for the thin wire constituting the reflected-light distribution pattern is that, in the wiring basic pattern, an area that is a value acquired by integrating the width of one or more curved thin wires, determined as the reflected-light distribution pattern according to the above definition, along the median line is larger than an area of the linear thin wire in the wiring basic pattern. The thin wire constituting the reflected-light distribution pattern must satisfy the requirement at minimum.

That is, the curved thin wire determined as the reflected-light distribution pattern according to the requirement and the linear thin wire connected to the curved thin wire are candidates for the reflected-light distribution pattern, and to allow these thin wire to actually function as the reflected-light distribution pattern, the above-mentioned requirement on area must be satisfied.

Preferably, the length of the linear thin wire included in the thin wire constituting the reflected-light distribution pattern is small as much as possible. In consideration of balance among uneven luminance and uneven display such as moire of an image or picture on the back surface of the touch screen, and electrical characteristics such as wiring resistance, the short linear thin wire can be used.

The reflected-light distribution pattern having the smallest area surrounded with the median line and the smallest length is the circular thin wire. Accordingly, the requirement for the thin wire having the smallest length according to the present invention is that, when a thin wire B having the same length as the length of a target thin wire A and the same uniform width as the largest width of the thin wire A is rounded to form a circular thin wire, the circular thin wire reliably has an area including no thin wire at the center and is not shaped like a disc, that is, is shaped like a circle "O" drawn by a line.

It is assumed that the wire B has the same length as the length of the concerned thin wire A, concentric contours, and the same width as the largest width of the thin wire A. The width and the length are acquired according to the same definition as in the thin wire according to the present invention. Given that the radius of the median line of the thin wire B is "r" and the width is "2a", r>a (r/a>1) satisfies the requirement and thus, the aspect ratio that is the ratio of the length 1 (1=2πr) to the width of the thin wire B should to be 1/2a=2πr/2a=πr/a>π. When the aspect ratio that is the ratio of the length to the largest width of the concerned thin wire A is π or more, even if the thin wire A is circular, an area having no thin wire reliably occurs at the center, and the median line and the normal line can be defined according to the definition of the thin wire of the present invention. Accordingly, it can be determined whether or not the thin wire A is the reflected-light distribution pattern, and the requirement for the aspect ratio is proper as the requirement for the thin wire having the smallest length according to the present invention. Although the definition of the thin wire has not been specifically described, in the projection view, a member having an aspect ratio, that is, length/(largest width) of π or more is defined as "thin wire", and wiring constituted of the thin wire is defined as "thin wire wiring". As used herein, π is a circular constant.

A block-like wire having a small aspect ratio, not the thin wire, may be arranged on a circle with small gaps, or a plurality of block-like wires are alternately arranged in the pattern of a dartboard to form the reflected-light distribution pattern in appearance.

Even when the reflected-light distribution pattern is achieved in appearance, the gaps act as diffraction grating, and the reflected light is distributed in directions other than the regular reflection, decreasing the visibility. In this case, since the gaps are densely arranged, the diffraction efficiency to the higher angle side is high, which is more disadvantageous.

Reflection of diffracted light from the thin wire is considered. For sake of simplicity, it is assumed that monochromatic light that can be approximated by a planar wave is incident in the direction of the normal line from the front surface of the transparent base 19. The repetition cycle of the basic pattern of the detection wires 2 and 3 is set so as to satisfy the detection accuracy of the touch position, typically, the locational accuracy acquired by indication with a finger or pen, that is, about a few mm, which is much smaller than the distance with which the user views the touch screen (about 10 cm or more) to approximate light diffraction to Fraunhofer diffraction. Accordingly, the diffraction pattern of vertically incident light can be approximated to the square (intensity) of magnitude of Fourier transform of the wiring pattern. The approximation accurately holds in the case where the distance of the surface of the thin wire from the front surface of the touch screen is uniform, and no reflected light occurs in the no-wiring portion, but even in the other cases, it is sufficient approximation to briefly make qualitative description.

Figure 14:
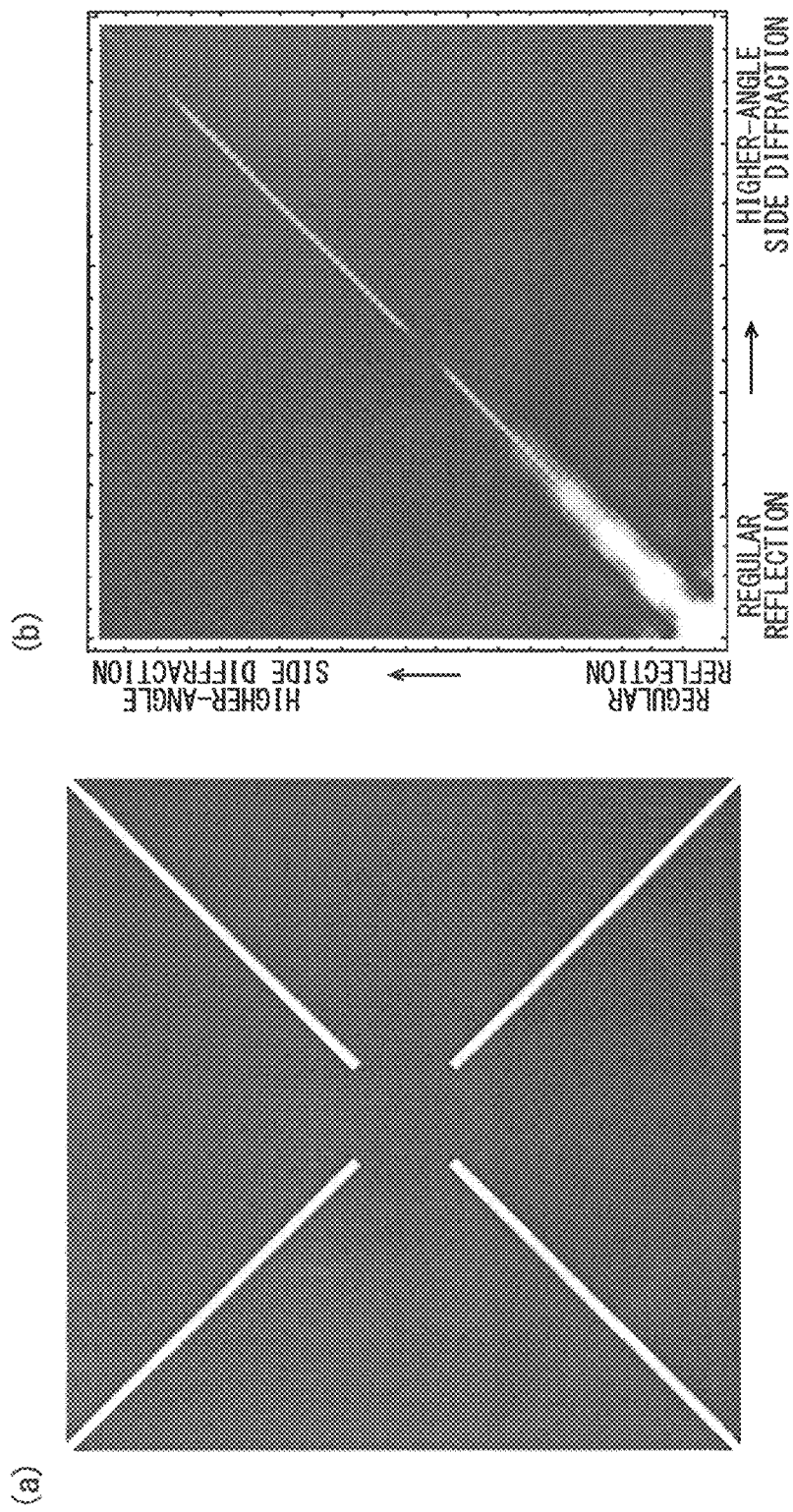
FIG. 14 is a view showing an example of a wiring basic pattern and the Fourier transform thereof in the vicinity of a DC component.

FIG. 14 is a view showing an example of the wiring basic pattern and the vicinity of a DC component of Fourier transform. In FIG. 14, to satisfy the approximation and make the behavior of reflected diffracted light clear, electrical connection of wires is ignored. Part (a) of FIG. 14 is a view showing the example of the simplified wiring basic pattern, and part (b) of FIG. 14 is an enlarged view showing the vicinity of a DC component of Fourier transform in the basic pattern in part (a) of FIG. 14. In part (a) of FIG. 14, a white area represents an area where the thin wire is present and a black area represents an area where the thin wire is absent.

In the state where the basic pattern in part (a) of FIG. 14 is repeated to fill the entire front surface of the transparent base 19, distribution of reflected diffracted light when monochromatic light that can be that can be approximated by a planar wave is incident in the direction of the normal line from the front surface of the transparent base 19 serves as Fourier transform view in part (b) of FIG. 14. In Fourier transform view in part (b) of FIG. 14, a white area represents intense reflected light, and a black area represents weak reflected light. Describing in detail, it is a grayscale in which the intensity 0 is shown in black, and the largest intensity except for higher 1% (about 99/100, the intensity of the higher 1%) is shown in white.

A left lower corner (origin) of the Fourier transform view in part (b) of FIG. 14 corresponds to regular reflection, and the vertical axis and the horizontal axis in the Fourier transform view in part (b) of FIG. 14 represent diffraction angle and are proportional to the inverse of wavelength. Thus, as diffracted light is away from the origin, diffracted light reflects with a larger diffraction angle to right along the horizontal axis, upward along the vertical axis, and to the upper right between the horizontal axis and the vertical axis (inner side in the figure). Because the basic pattern is symmetric, the directions except for upper right direction are rotationally symmetric about the lower left corner of the Fourier transform view in part (b) of FIG. 14.

The Fourier transform view in part (b) of FIG. 14 corresponds to the case where planar wave of monochrome (single wavelength) is incident. When wavelength of light changes, the vertical axis and the horizontal axis of the Fourier transform view in part (b) of FIG. 14 change by the same factor. Thus, the diffraction angle changes, while the diffraction direction does not change. For example, in part (b) of FIG. 14, diffracted light reflects at 45 degrees and is broken on the way, and it can be seen that monochromatic light has a diffraction angle at which diffracted light does not reflect at 45 degrees. However, when light having different wavelengths is simultaneously incident, for example, illuminated by white light, light is diffracted at 45 degrees, but diffraction angle changes at which light is not diffracted, depending on wavelength and thus, rainbow-like color variation in the direction of 45 degrees appears.

Part (a) of FIG. 14 is a simulation of the linear basic pattern of 45 degrees having a slit, indicating that intense diffracted light reflects at 45 degrees that is the extending direction of the thin wire. When the basic pattern in part (a) of FIG. 14 fills space, an area having the thin wire and an area having no thin wire cyclically appear on a straight line having any inclination. That is, the thin wire is cyclically present in any direction, diffracted light theoretically occurs in any direction, and intense reflected diffracted light occurs in the extending direction of the thin wire.

Figure 15:
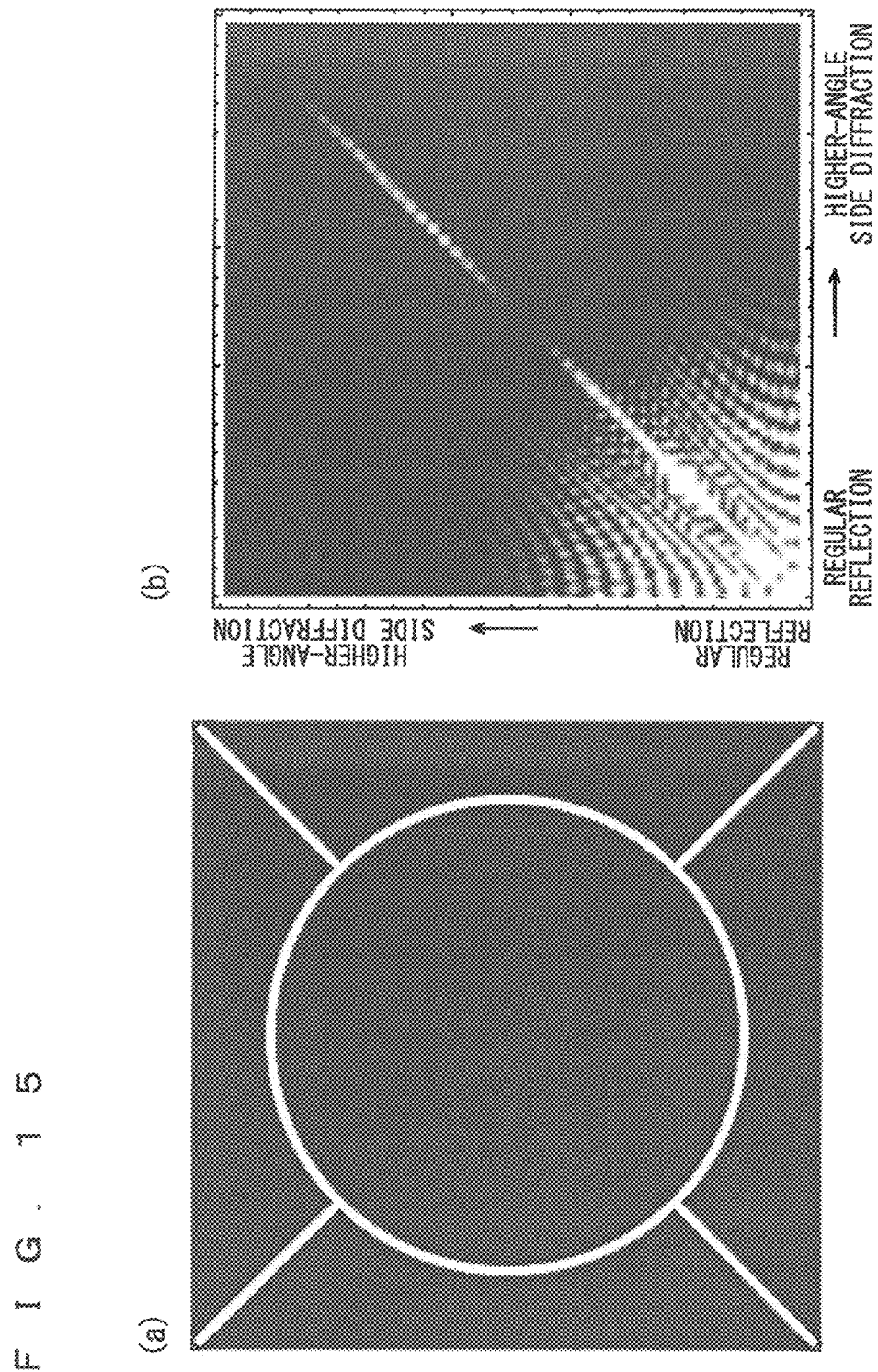
FIG. 15 is a view showing an example of the wiring basic pattern and the Fourier transform thereof in the vicinity of a DC component.

FIG. 15 is a view showing an example of the wiring basic pattern and the vicinity of a DC component of Fourier transform. Part (a) of FIG. 15 is a view showing the example of the simplified wiring basic pattern, and part (b) of FIG. 15 is an enlarged view showing the vicinity of the DC component of Fourier transform in the basic pattern in part (a) of FIG. 15. In part (a) of FIG. 15, a white area represents an area where the thin wire is present and a black area represents an area where the thin wire is absent. In FIG. 15, the basic pattern in which the linear thin wires are connected to the circular thin wire as a reflected light distributing block as shown in FIG. 2 is simulated, and diffracted light reflects at 45 degrees from the linear thin wires, however, diffracted light also reflects from the circular thin wire in other directions, reducing the possibility that intense reflected light occurs only in the specific direction to improve visibility.

Viewing in detail, the Fourier transform view in part (b) of FIG. 15 is fan-shaped, however, reflected diffracted light actually occurs in all directions. Reflected diffracted light appears from the circular thin wire in the normal lines. In fact, reflected diffracted light occurs in the extending direction of the thin wire, but since the extending direction of the thin wire is the tangent line direction of the median line of the thin wire, and is orthogonal to the normal line direction, the thin wire having normal lines heading for all directions, meeting a requirement for the reflected-light distribution pattern, has extending directions heading for all directions. Accordingly, the reflected-light distribution pattern may be determined based on the normal line direction. According to the present invention, the reflected-light distribution pattern is defined by the normal line direction based on the appearance of the reflected diffracted light from the circular thin wire. As needed, the normal line direction can be replaced with the extending direction.

In part (b) of FIG. 15, reflected light having a small diffraction angle, which is close to regular reflection, heads for all directions, indicating that, when illuminated by spot-like light, the boundary of an image on the touch screen at regular reflection looks blurred, that is, the same effect as anti-glare (glare-proof) treatment can be obtained.

That Fourier transform view in part (b) of FIG. 15 is shaped like fan bones is an apparent phenomenon caused by the fact that a calculation unit cell and a calculation area used for calculation of Fourier transform have a finite size. For example, given that the calculation unit cell is 1 mm×1 mm and the calculation area is 10 mm×10 mm, the possible minimum cycle is 2 mm in the vertical or horizontal direction (white-and-black repetition of every 1 mm) and the maximum cycle is 10 mm in the vertical or horizontal direction (white-and-black repetition of every 5 mm). However, in the case of the direction slightly displaced from the horizontal direction, the direction of the cyclic structure of white-and-black repetition of every 5 mm in the horizontal direction (0 degrees) and white-and-black repetition of every 1 mm in the vertical direction (90 degrees) is $\tan^{-1}(2/10)$ =11.3 degrees, and directions between the horizontal direction (0 degrees) and the direction of 11.3 degrees cannot be expressed.

Figure 16:
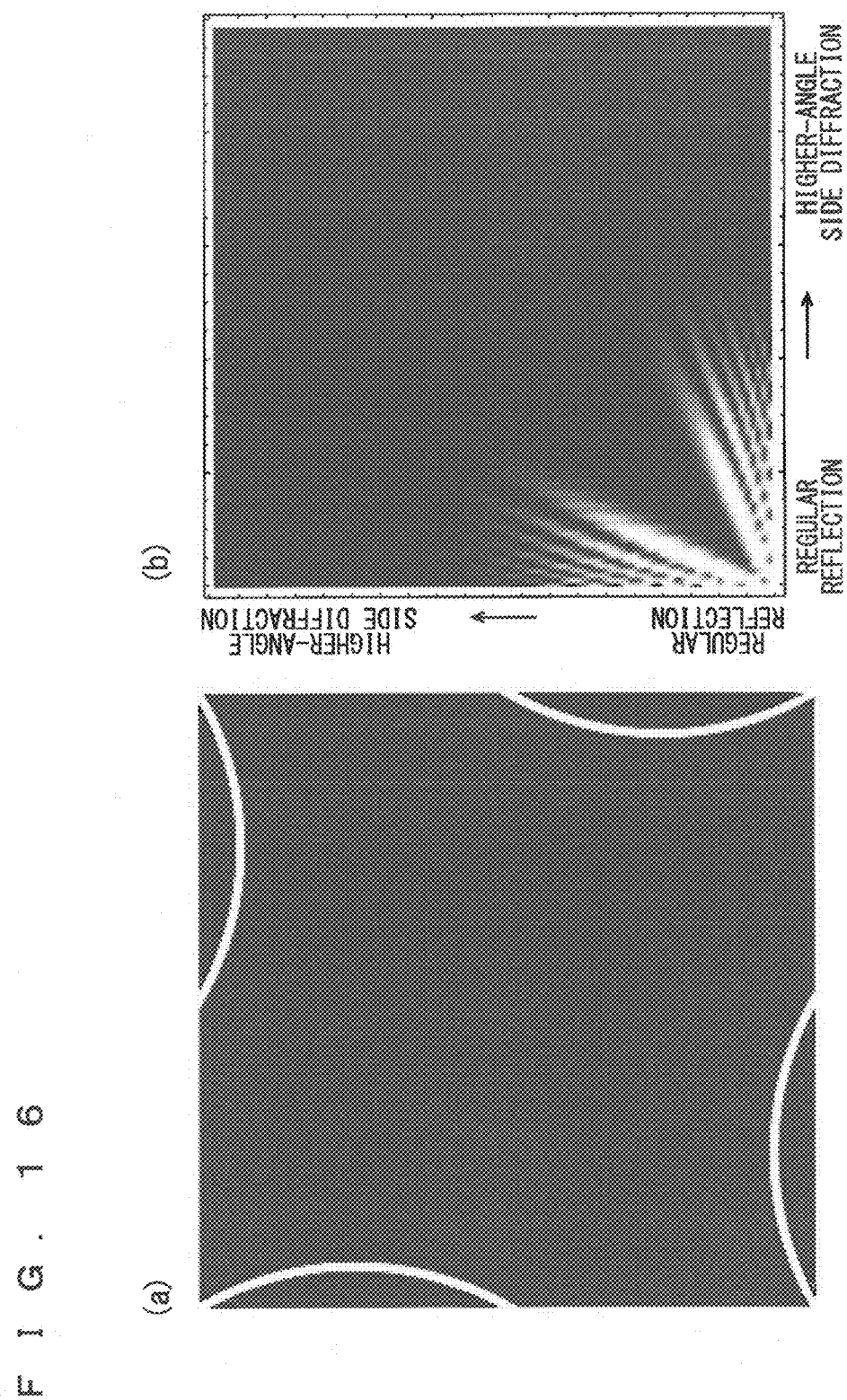
FIG. 16 is a view showing an example of the wiring basic pattern and the Fourier transform thereof in the vicinity of a DC component.

FIG. 16 is a view showing an example of the wiring basic pattern and the vicinity of a DC component of Fourier transform. Part (a) of FIG. 16 is a view showing the example of the simplified wiring basic pattern, and part (b) of FIG. 16 is an enlarged view showing the vicinity of the DC component of Fourier transform in the basic pattern in part (a) of FIG. 16. In part (a) of FIG. 16, a white area represents an area where the thin wire is present and a black area represents an area where the thin wire is absent.

In FIG. 16, the basic pattern configured of the 60 degrees arc-shaped thin wire is simulated, a lower right arc-shaped thin wire protruding to left and an upper left arc-shaped thin wire protruding to right of the adjacent basic pattern (not shown) are connected to each other, and extend substantially vertically. The upper and lower arc-shaped thin wires also extend substantially horizontally. Since no reflected-light distribution pattern is present, diffracted light does not reflect in the range of 45 degrees±15 degrees (width of 30 degrees). When there is a lack of the normal line direction of the thin wire in a certain angle range (the thin wire having the normal line in the angle range is not present), diffracted light does not reflect in the direction.

As described above, when the normal lines of the thin wire head for all directions, reflected light head for all directions, and therefore this is used as the requirement for the reflected-light distribution pattern. That is, although it is the most desirable that the normal lines accurately head for all directions as in the circular thin wire, the normal lines do not need to head for all directions. When reflected light from one point on the touch screen enters into either of the user's eyes, presence or absence of reflected light is not abruptly sensed, which is enough practical. Since the distance between both eyes of the human is about 6.5 cm, the requirements at viewing distances of 20 cm (for example, the user holds a portable terminal in front of eyes and operates the terminal with a finger), 50 cm (for example, the user operates a ticket vending machine with an elbow being somewhat stretched), and 80 cm (for example, the user operates a digitizer on a desk with a pen) are about 16.7 degrees, 6.8 degrees, and 4.3 degrees, respectively.

Thus, to allow the thin wire to function as the reflected-light distribution pattern, it is most desired that the normal lines head for all directions, however, an angle range in which diffracted light need not reflect, that is, a consecutive allowable angle range in which the normal line does not head for the direction to allow the thin wire to function as the reflected-light distribution pattern, is practically at least 16.7 degrees or less, desirably 6.8 degrees or less, and more desirably 4.3 degrees or less. The number of allowable angle ranges may be plural, but as a matter of course, is preferably small. As described above, the case where many slits are present to reduce the length of the thin wire constituting the reflected-light distribution pattern is not preferable, and the aspect ratio of the thin wire has a lower limit.

As in a black matrix of a monitor using LCD, the thin wire having a width of 10 μm or less are hard to be viewed under light passing through the touch screen. To improve the transmittance of the touch screen as well as the visibility of the thin wire, the width of the thin wire is desirably small. However, when the width of the thin wire is small, the problem that the resistance increases and the risk of broken line increases, make a trade-off depending on used detection circuit and processing technique.

In terms of uniformity of the detection accuracy of the touch position in the operational region, it is desired that the width of all wires except for the crossed portions and connecting portions with the branch thin wire have an optimum value in consideration of trade-off, and at least the width of the thin wires in the same layer produced according to the same process has the same value. Since the area of the crossed portions is small in wiring of small width, a higher priority may be given for ensuring the touch capacitance required for detection to adjust the area. The connecting portions, in particular, portions on which the contour of a different thin wire abuts, cannot be often machined into a desired shape depending on the machining accuracy of the manufacturing process, and may be shaped assigning a higher priority to the manufacturing process.

Desirably, a metal oxide or nitride is formed on the surface of the wire to decrease the reflectance of the surface. Although this cannot make the reflectance 0 in the entire visible wavelength band, the luminance of reflected light can be advantageously lowered.

As described above, since the touch screen 1 in this embodiment has the above-mentioned reflected-light distribution pattern, when the touch screen is illuminated by spot-like external light such as sunlight or bulb light, reflected light from the reflected-light distribution pattern occurs in all directions. By contrast, according to the conventional art, intense reflected light occurs in the extending direction of the linear wire. Thus, the possibility that reflected light occurs only in the specific direction can be eliminated and further, the effect of the anti-glare treatment can be obtained, which is excellent in visibility.

Since the touch screen 1 in this embodiment is a touch screen of the projected capacitive touch panel as described above, and thin wires are densely arranged, the inter-wire capacitance disadvantageously becomes large. In addition to an increase in wiring delay, in the case of using a mutual capacitance detection method, when the inter-wire capacitance between the detection column wires and the detection row wires is large, electrical field coupling between the column direction bundle wires and the row direction bundle wires that are detection electrodes becomes strong, resulting in that electrical field change obtained at touch of the indicator such as a finger, that is, mutual capacitance change becomes small. This causes the characteristic problem that the detection accuracy lowers.

The inter-wire capacitance is mainly composed of (1) coupling capacitance in the vicinity of the crossed portions of the detection column wires 2 and the detection row wires 3, and (2) coupling capacitance in the vicinity of portions in which the detection column wires 2 and the detection row wires 3 extend in parallel.

To reduce the inter-wire capacitance, for the coupling capacitance (1), reduction of the number of the crossed portions is effective, however, the number of the crossed portions cannot be reduced so as to sacrifice the detection accuracy of the touch position.

For the coupling capacitance (2), it is effective to increase the distance between the detection column wires 2 and the detection row wires 3 in the portions in which the detection column wires 2 and the detection row wires 3 extend in parallel. For example, in the crossed portion in which the thin wire constituting the detection column wire 2 and the thin wire constituting the detection row wire 3 cross each other, for example, a crossed portion C surrounded with a broken line in FIG. 2, when the median lines of the thin wires cross each other at right angle, that is, 90 degrees, and the detection column wire 2 is further from the detection row wire 3 as they are away from the crossed portion to avoid intricacy, the distance between the detection column wire 2 and the detection row wire 3 can be made large.

When wiring is installed such that the density and location of the crossed portions are the same in the configuration where the wiring pattern is configured as the linear thin wire as conventional as shown in FIG. 4 and where the wiring pattern is configured as the wiring pattern having the reflected-light distribution pattern according to the present invention as shown in FIG. 2, the distance between the detection column wire 2 and the detection row wire 3 is substantially the same in both configurations except for details such as the area including the reflected-light distribution pattern. However, the conventional wiring pattern has a lower thin wire density and thus, tends to cause uneven display. This is due to human's eye characteristics that the human's eyes can easily visually recognize, under cyclic variation of luminance, a narrower area having a different luminance included in an area of a longer cyclic luminance variation, that is, in a wider area of uniform luminance. By disposing the reflected-light distribution pattern as in this embodiment, the thin wire density can be increased to decrease uneven display.

For example, when the detection wires 2 and 3 are configured of linear thin wires as conventional as shown in FIG. 5, as in the conventional wiring pattern, the resistance of the detection wires 2 and 3 can be made small. For example, as shown in FIG. 2, even when the reflected-light distribution pattern is electrically connected to at least one of the detection column wire 2 and the detection row wire 3 and serves as a part of the wire, by electrically connecting the reflected-light distribution pattern by the linear thin wire, the resistance of the detection wires 2 and 3 can be made small.

Summarizing the effect of the present invention, a decrease in transmittance in the wiring portions of the touch screen when the wires are made of an opaque material or light reflective material such as metal can be prevented by using thin wire wiring.

By bringing the predetermined number of detection column wires 2 into one bundle of column-direction bundle wires 6 and the predetermined number of detection row wires 3 into one bundle of row-direction bundle wires 7, the effect of broken line as a disadvantage of thin wiring can be suppressed to prevent the decrease in the transmittance of the touch screen, and to make electrical characteristics uniform in a wider area. This enables uniform detection of the touch capacitance.

Since the decrease in the transmittance can be prevented by thin wiring, the thin wire density can be increased to reduce uneven display. However, when the distance between the detection column wires 2 and the detection row wires 3 is decreased, the parasitic capacitance, specifically, inter-wire capacitance between the wires disadvantageously becomes large.

By disposing the reflected-light distribution pattern 11 constituted of the curved thin wire, the thin wire density increases and the distance between the detection column wires 2 and the detection row wires 3 also increases, suppressing an increase in the inter-wire capacitance.

By suppressing the increase in the inter-wire capacitance, the touch position can be detected with high accuracy. Further, the thin wire density increases, reducing uneven display as well.

Since reflected light and reflected diffracted light from the reflected-light distribution pattern 11 formed of the curved thin wire head for all directions, the possibility that reflected light occurs only in the specific direction when illuminated by spot-like light can be eliminated. Therefore, the visibility can be improved.

As has been described, in this embodiment, the predetermined number of detection column wires 2 and the predetermined number of detection row wires 3 are bundled into one bundle of column-direction bundle wires 6 and one bundle of row-direction bundle wires 7, respectively, and the reflected-light distribution pattern 11 constituted of the thin wire including the curved thin wire is disposed. This can suppress lowering of visibility due to reflected light and uneven display. Moreover, this can suppress degradation of electrical characteristics such as the inter-wire capacitance, and enable uniform and highly-sensitive detection of the touch capacitance.

In this embodiment, in the reflected-light distribution pattern 11, as shown in FIG. 2 as described above, the thin wire including the curved thin wire is closed. Thus, the reflected-light distribution pattern in which the normal lines of the curved portion head for all directions can be realized.

In this embodiment, the reflected-light distribution pattern 11 may be included in at least one of the detection column wire 2 and the detection row wire 3. As shown in FIG. 2, the reflected-light distribution pattern 11 may be included in the detection column wire 2 and the detection row wire 3.

For example, as shown in FIG. 5, the reflected-light distribution pattern 11 may be electrically separated, that is, insulated from the detection column wire 2 and the detection row wire 3.

In both cases where the reflected-light distribution pattern 11 is included in at least one of the detection column wire 2 and the detection row wire 3 and where the reflected-light distribution pattern 11 is separated from the detection column wire 2 and the detection row wire 3, the possibility that intense reflected light occurs only in the specific direction when illuminated by spot-like external light such as sunlight or bulb light as described above can be advantageously eliminated.

Second Embodiment

FIG. 17 is a projection view showing a wiring pattern of a touch screen 30 in Second embodiment of the present invention. In the touch screen 30 in this embodiment, thin wires constituting the detection column wires 32 and the detection row wires 33 are curved lines including the closed reflected-light distribution pattern 11.

Specifically, as shown in FIG. 17, in this embodiment, the linear thin wire connecting the reflected-light distribution pattern of the touch screen 1 in First embodiment in FIG. 2 is replaced with a corrugated thin wire. This can further decrease the inter-wire capacitance.

Since merely replacement of the linear thin wire with the corrugated thin wire increases the resistance of the detection wires 32, 33, measures for reducing the resistance, such as increasing the thickness of the thin wire and the use of a low resistance material may be also adopted to balance the increase in resistance and the effect of reducing capacitance.

When the procedure of selecting the reflected-light distribution pattern as described in First embodiment is applied to wires in a region B in FIG. 17, first, four circular thin wires 11 are selected as the reflected-light distribution pattern in the case (a). Next, thin wires that are configured of a thin wire 34a having the same shape as the corrugated thin wire connecting the 90 degrees arc-shaped thin wire 171 and thin wire 173 in FIG. 13 and a thin wire 34b having the same shape as the thin wire connecting the 90 degrees arc-shaped thin wire 172 and thin wire 174 in FIG. 13 at the center of the region B, the thin wires connecting the circular thin wires 11 and having a substantially cross gammadion shape are selected according to the case (d) with four end points. Further, four 90 degrees arc-shaped thin wires 36 that extend outward from the region B and are parts of the thin wires connecting the circular thin wires 11 can be selected according to the case (d) with eight end points. That is, the detection column wires 32 and the detection row wires 33 except for branch thin wires 35 are configured of the thin wires constituting the reflected-light distribution pattern.

Since four remaining branch thin wires 35 extending from the circular thin wire 11 are parts dividing the thin wires as represented in a circle D drawn by a broken line in FIG. 17, and the central angle of the arc is smaller than 90 degrees, the branch thin wires do not collectively constitute the reflected-light distribution pattern. However, by using the 90 degrees arc-shaped thin wire having a small radius, the branch thin wires 35 can function as the reflected-light distribution pattern.

As used herein, the expression that the detection wires include the reflected-light distribution pattern means a following case. The detection wires 2 and 3 pass through the basic pattern as a wiring repetition unit, for example, the rectangular region B surrounded by the chain double-dashed line in FIG. 2, and an end of the region of the basic pattern is electrically connected to another end of the region of the basic pattern along the detection column wire 2 in the basic pattern to electrically connect the basic patterns to each other. This also applies to the detection row wire 3. In the case where electrical connection of the detection column wire 2 in the basic pattern can be broken by breaking on purpose the thin wire constituting the reflected-light distribution pattern in the basic pattern, that is, the thin wire electrically connected from an end of the region of the basic pattern to another end of the region along the detection column wire 2 cannot maintain the connection only with the thin wires within the basic pattern, the detection column wire 2 is regarded as including reflected-light distribution pattern. For example, in the region B in FIG. 17, an upper thin wire 36 constituting the detection column wire 32 is connected to a lower thin wire 36 through the circular thin wire 11, the thin wire 34a, and the circular thin wire 11, however, by breaking the circular thin wire at a plurality of points, electrical connection of this path can be broken. This can also apply to the detection row wire 3.

In the case of the wiring pattern including the reflected-light distribution pattern, the entire detection column wires 32 and the detection row wires 33 need not constitute the reflected-light distribution pattern. For example, a part of the arc-shaped or elliptic thin wire having a central angle less than 90 degrees may be merely curved so as to have projections and depressions. Alternatively, a plurality of points may be taken on the median line of such curved thin wire, and a short linear thin wire may be connected so as to have a straight line connecting the points in order as a median line. In this case, it is desired that the number of the plurality of points including the end points is eight or more, specifically, the number of the depressions is four or more and the number of the projections is four or more.

As described above, in this embodiment, the end points of the curved thin wire are connected with the curved thin wire and therefore, as compared to the case where the end points are connected with a long linear thin wire, a decrease in visibility due to reflected light can be reduced.

Figure 18:
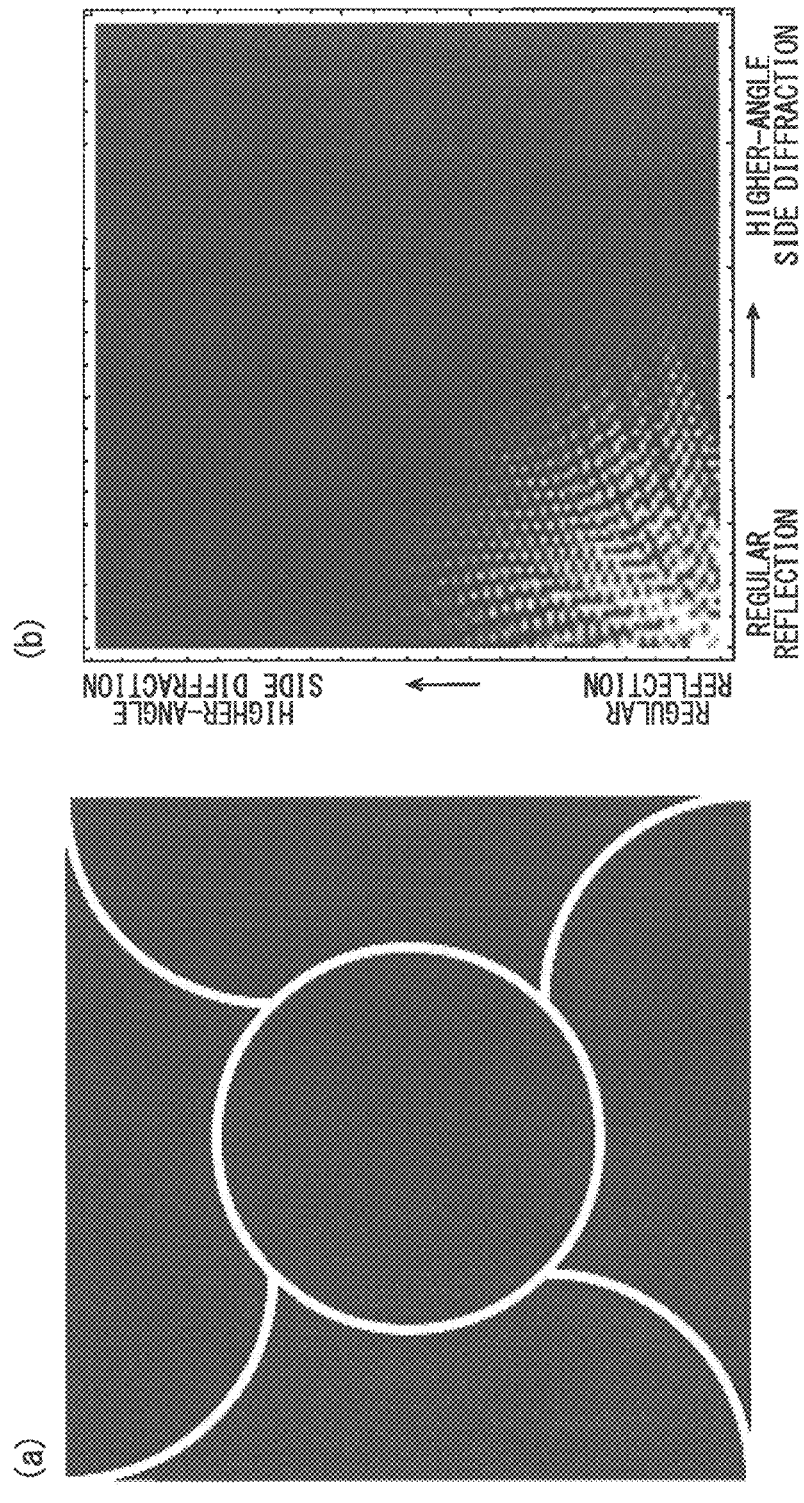
FIG. 18 is a view showing an example of the wiring basic pattern and the Fourier transform thereof in the vicinity of a DC component.

Like FIGS. 14 to 16, FIG. 18 is a view showing an example of the wiring basic pattern and the vicinity of a DC component of Fourier transform. Part (a) of FIG. 18 is a view showing the example of the simplified wiring pattern, and part (b) of FIG. 18 is an enlarged view showing the vicinity of the DC component of Fourier transform in the basic pattern in part (a) of FIG. 18. In part (a) of FIG. 18, a white area represents an area where the thin wire is present and a black area represents an area where the thin wire is absent. Since the wiring pattern in part (a) of FIG. 18 is a simulation of the wiring pattern formed of the circular thin wire and the 90 degrees arc-shaped thin wire as in FIG. 17, and thus, there is no linear thin wire and the normal lines of the thin wire head for all directions, diffracted light reflects in all directions, preventing the situation in which intense reflected light occurs only in the specific direction to further improve visibility.

In part (b) of FIG. 18, reflected light having a small diffraction angle, which is close to regular reflection, heads for all directions, indicating that, when illuminated by spot-like light, the boundary of an image on the touch screen at regular reflection looks blurred, that is, the same effect as anti-glare (glare-proof) treatment can be obtained.

Although circumferences of the circular thin wires 11 are connected to each other via the 90 degrees arc-shaped thin wire 34 in FIG. 17, centers of the circular thin wires 11 may be connected to each other. Other shapes may be adopted. To prevent uneven display, the branch thin wire or separated thin wire may be disposed, however, the curved shape as in this embodiment is desirable, and most desirably, the curved thin wires function as the reflected-light distribution pattern.

By using the closed reflected-light distribution pattern having a large area surrounded with the thin wire, the length of the thin wire at the place where the detection column wire 32 is close to the detection row wire 33 can be reduced, ensuring a large average distance between the detection column wire 32 and the detection row wire 33.

Since the touch screen 30 having the reflected-light distribution pattern in this embodiment does not include a long linear thin wire in the basic pattern of repeated wires, when the touch screen is illuminated by spot-like external light such as sunlight or bulb light, reflected light from the reflected-light distribution pattern occurs in all directions. By contrast, according to the conventional art, intense reflected light occurs in the extending direction of the linear wire. Thus, the possibility that reflected light occurs only in the specific direction can be eliminated and further, the effect of the anti-glare treatment can be obtained. Therefore, a decrease in visibility can be prevented. The inter-wire capacitance can be reduced, which is excellent in electrical characteristics.

Third Embodiment

Figure 19:
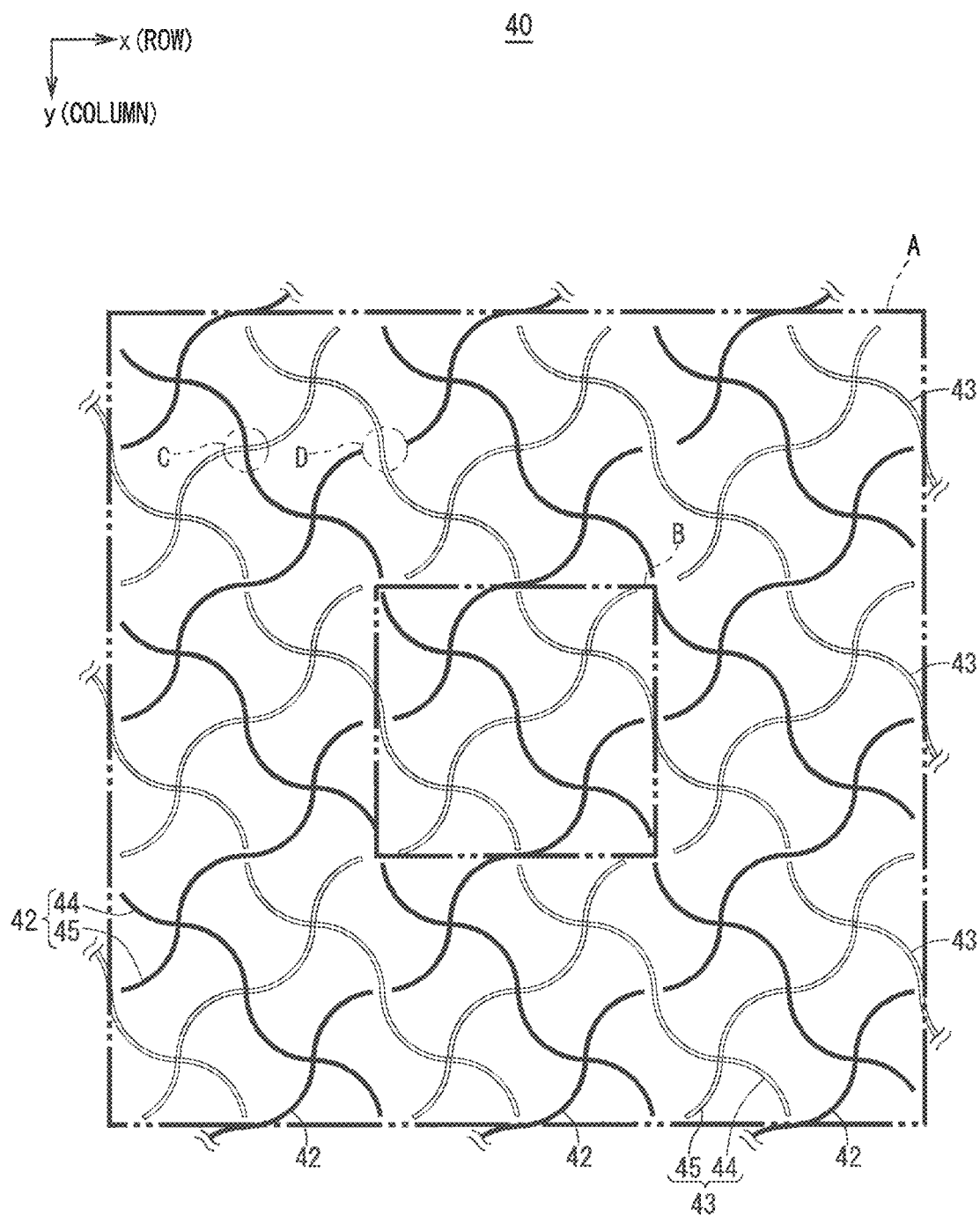
FIG. 19 is a projection view showing a wiring pattern on a touch screen 40 in accordance with Third embodiment of the present invention.

FIG. 19 is a projection view showing a wiring pattern of a touch screen 40 in Third embodiment of the present invention. Also in this embodiment, detection wires 42 and 43 are configured to function as the reflected-light distribution pattern. In this embodiment, as shown in FIG. 19, the detection wires 42 and 43 do not use the closed thin wire, that is, the thin wire having the closed median line.

Specifically, the detection wires 42 and 43 are not straight line, but corrugated curved thin wires connecting 90 degrees arc-shaped thin wires having projections and depressions. The projection is opposed to the depression. When the selection procedure of the reflected-light distribution pattern in First embodiment is applied to wires in the region B in FIG. 19, two corrugated thin wires connected in a substantially cross gammadion shape at the center of the region B are selected according to the case (d) with four end points. Further, four 90 degrees arc-shaped thin wires that extend outward from the region B and are parts of the thin wires can be selected according the case (d) with eight end points. Since branch thin wires 44 and 45 are parts dividing the thin wire as represented in circle D drawn by a broken line in FIG. 17, and the central angle of the arc is smaller than 90 degrees, the branch thin wires do not collectively constitute the reflected-light distribution pattern. However, by using the 90 degrees arc-shaped thin wire having a small radius, the branch thin wires 44 and 45 can function as the reflected-light distribution pattern. As in the case where the closed reflected-light distribution pattern 11 is used as in First and Second embodiment, the length of the thin wire at the place where the detection column wire 42 is close to the detection row wire 43 can be reduced, ensuring a large average distance between the detection column wire 42 and the detection row wire 43.

The requirement will be described in detail. For the thin wire except for the branch thin wire, which constitutes the detection wire 42 or 43, a corrugated upward-sloping or downward-sloping thin wire having a projection and depression formed by connecting two 90 degrees arc-shaped thin wires is repeated downward, and an average in the extending direction in the repetition unit is defined as an average direction of the extending direction. In FIG. 19, the repetition unit is a part of the reflected-light distribution pattern, however, generally the repetition unit is also considered in other cases.

A point P is taken on the contour of the concerned thin wire, and an intersection point q is taken on the contour of another thin wire that passes the point P, has a contour crossing a straight line orthogonal to the average direction of extending direction, and is not electrically connected to the thin wire on which the point P is placed. While the inclination of the straight line is maintained, an intersection point P' with the contour of the thin wire on which the point P is placed when the straight line is moved in parallel, an intersection point q' with the contour of the thin wire on which the point q is placed, and a distance between the intersection point P' and the intersection point q' are found. Next, a section Zp of the intersection point P' and a corresponding section Zq of the intersection point q', in which the distance does not change even when the straight line is moved in parallel, are found.

It is assumed that the section Zp of the thin wire on which the intersection point P' is placed is parallel to the section Zq of the thin wire on which the intersection point q' is placed.

In the case where a parallel section between adjacent thin wires is long, when the distance between the thin wires in the parallel section, specifically, a distance between the point p and the point q when the point p is taken in the section is made long, the wiring density in the parallel section between the adjacent wires lowers. When the detection wires 42 and 43 serve as the reflected-light distribution pattern, to increase the average distance between the adjacent thin wires and prevent a decrease in the wiring density, it is desired that the parallel section is smaller than the average distance between the adjacent thin wires, and it is most desired that there is no parallel section. The average distance between the adjacent thin wires means an average distance between the point p and the point q in the case where the same thin wire moves in the in the adjacent ranges.

In the wiring pattern in FIG. 19, there is no parallel section. Average angles of the upward-sloping corrugated portions of the adjacent detection column wire 42 and detection row wire 43 in the extending direction are both 45 degrees, but the distance therebetween is not uniform and varies. Average angles of the downward-sloping portions of the adjacent detection column wire 42 and detection row wire 43 are both −45 degrees, but the distance therebetween is not uniform and varies as in the upward-sloping portions.

In addition to the case where the detection wires are formed of only the curved thin wires as in this embodiment, in the wiring pattern including the linear thin wire as shown in FIG. 2, the parallel section between adjacent thin wires can be eliminated. For example, in the wiring pattern in FIG. 2, the thin wire size is adjusted so as to come into contact with one circular thin wire along the straight line that abuts the contour of another circular thin wire at ±45 degrees that is the extending direction of the linear thin wire to eliminate the parallel section.

As described above, preferably, the plurality of reflected-light distribution patterns 11, 42, and 43 are disposed on the transparent base 19 so as not to form parallel sections between the adjacent reflected-light distribution patterns 11, 42, and 43. By providing the plurality of reflected-light distribution patterns 11, 42, and 43 in this manner, the average distance among the adjacent reflected-light distribution patterns 11, 42, and 43 can be made large, and a decrease in the wiring density can be prevented.

Although the branch thin wire or the separated thin wire may be disposed to address with uneven display, it is desired that the disposed branch thin wire or separated thin wire functions as the reflected-light distribution pattern.

Since the touch screen 40 having the reflected-light distribution pattern does not include the linear thin wire in the basic pattern of repeated wires, when the touch screen is illuminated by spot-like external light such as sunlight or bulb light, the possibility that reflected light occurs only in the specific direction can be eliminated, and the effect of the anti-glare treatment can be obtained. By contrast, according to the conventional art, intense reflected light occurs in the extending direction of the linear wire. Therefore, the touch screen 40 in this embodiment has outstanding visibility. The touch screen has a small inter-wire capacitance, can reduce wiring delay and improve responsiveness, and has excellent electrical characteristics.

In this embodiment, in the touch screen 40, the thin wire constituting the detection wires 42 and 43 has the branch thin wire, but does not include the thin wire that are not electrically connected to, that is, separated from the detection wires 42 and 43. The present invention is not limited to this, and one or both of the branch thin wire and the thin wire that are not electrically connected to, that is, separated from the detection wires 42 and 43 may be disposed in the touch screen 40. This can increase the thin wire density.

Fourth Embodiment

As the reflected-light distribution pattern in which the median line is closed, the reflected-light distribution pattern 11 is exemplified that is formed of the circular thin wire in First and Second embodiments as shown in FIG. 2 and FIG. 17. In the case of using the reflected-light distribution pattern in which the median line is closed, as compared to the case where the reflected-light distribution pattern is not used, the thin wire density can be increased. However, in the reflected-light distribution pattern in which the median line is closed, the area of the region including no thin wire may become large. This region locally has a high transmittance, easily causing uneven display. In this embodiment, a method for improving the visibility due to reflected light and suppressing uneven display will be described.

Figure 20:
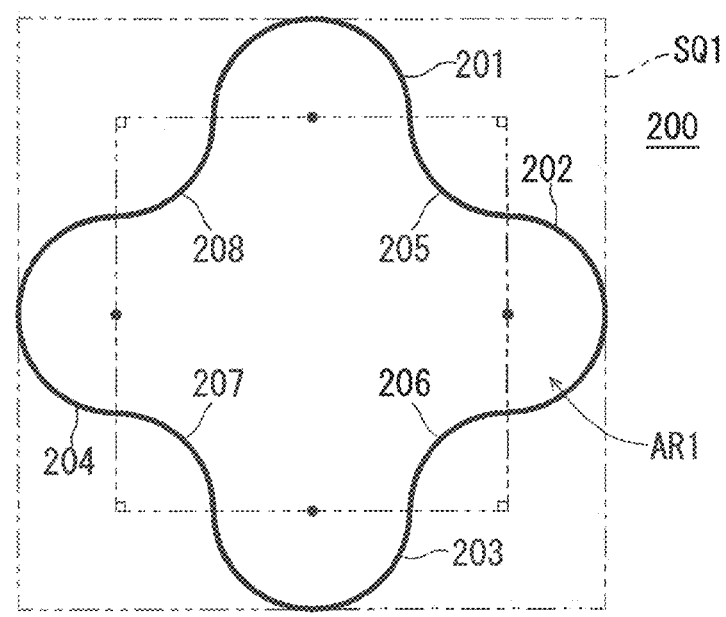
FIG. 20 is a projection view showing an example of a reflected-light distribution pattern in Fourth embodiment of the present invention.

FIG. 20 is a projection view showing an example of the reflected-light distribution pattern in Fourth embodiment of the present invention. In FIG. 20, for convenience of understanding, the thin wire constituting the reflected-light distribution pattern is represented by a thick solid line. A reflected-light distribution pattern 200 in FIG. 20 is configured of a closed thin wire in overall shape formed by connecting four 180 degrees arc-shaped, that is, semi-circular thin wires 201 to 204 via four 90 degrees arc-shaped thin wires 205 to 208, to form a four-leaf clover-like (hereinafter may be referred to as "four-leaf clover-shaped") thin wire. In FIG. 20, centers of circles defining the semi-circular thin wires 201 to 204 are represented by black circles.

The four semi-circular thin wires 201 to 204 are disposed such that chords of arcs of the two thin wires are parallel to each other. Specifically, the two semi-circular thin wires 202 and 204 are spaced such that chords of their arcs are parallel to each other in the vertical direction seen on the plane of FIG. 20. The two remaining semi-circular thin wires 201 and 203 are spaced such that chords of their arcs are parallel to each other in the horizontal direction seen on the plane of FIG. 20. The 180 degrees arc-shaped thin wires 201 to 204 as the semi-circular thin wires and the median lines of the 90 degrees arc-shaped thin wires 205 to 208 have the same radius.

Figure 21:
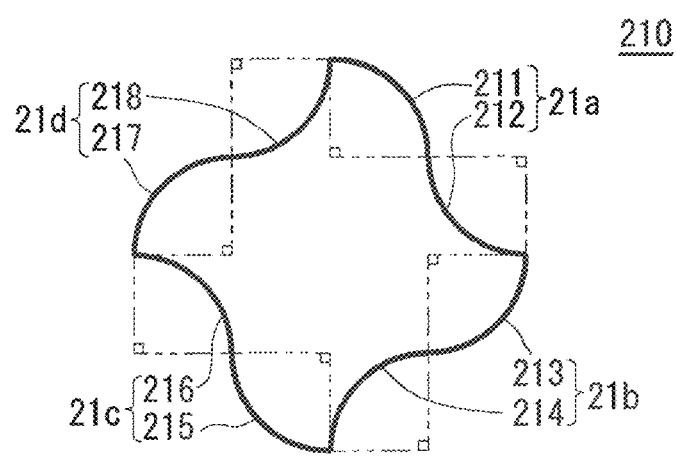
FIG. 21 is a projection view showing another example of the reflected-light distribution pattern in Fourth embodiment of the present invention.

FIG. 21 is a projection view showing another example of the reflected-light distribution pattern in Fourth embodiment of the present invention. In FIG. 21, for convenience of understanding, a thin wire constituting the reflected-light distribution pattern is represented by a thick solid line. A reflected-light distribution pattern 210 shown in FIG. 21 is configured of a closed thin wire in overall shape formed by connecting corrugated thin wires 21*a* to 21*d*, each of which is configured of two thin wires among 90 degrees arc-shaped thin wires 211 to 218, such that their median lines form 90 degrees at their end points, to become the windmill-shaped thin wire. The median lines of the 90 degrees arc-shaped thin wires 211 to 218 have the same radius.

Figure 22:
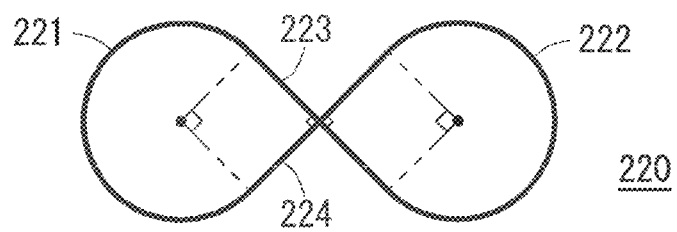
FIG. 22 is a projection view showing another example of the reflected-light distribution pattern in Fourth embodiment of the present invention.

FIG. 22 is a projection view showing another example of the reflected-light distribution pattern in Fourth embodiment of the present invention. In FIG. 22, for convenience of understanding, a thin wire constituting the reflected-light distribution pattern is represented by a thick solid line. A reflected-light distribution pattern 220 shown in FIG. 22 is configured of a closed thin wire in overall shape by disposing two 270 degrees arc-shaped thin wires 221 and 222 having the same radius such that their chords are opposed to each other via two linear thin wires 223 and 224 that are orthogonal to each other, to become a thin wire in a "∞" shape representing infinitude.

In FIG. 22, centers of circles defining the 270 degrees arc-shaped thin wires 221 and 222 are represented by black circles. The two linear thin wires 223 and 224 extend at +45 degrees and −45 degrees using a line segment connecting the centers of the circles of the two 270 degrees arc-shaped thin wires 221 and 222 to each other as a reference (0 degrees).

Figure 23:
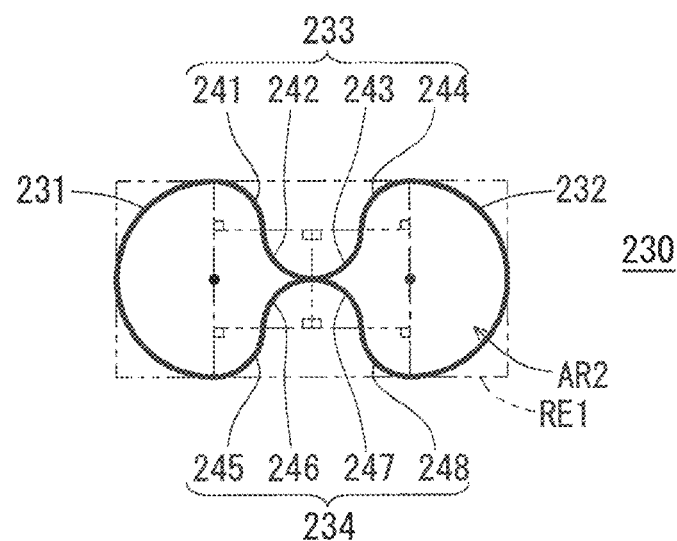
FIG. 23 is a projection view showing another example of the reflected-light distribution pattern in Fourth embodiment of the present invention.

FIG. 23 is a projection view showing another example of the reflected-light distribution pattern in Fourth embodiment of the present invention. In FIG. 23, for convenience of understanding, a thin wire constituting the reflected-light distribution pattern is represented by a thick solid line. A reflected-light distribution pattern 230 shown in FIG. 23 is configured of a closed thin wire in overall shape by disposing the two 180 degrees arc-shaped thin wires 231 and 232 having the same radius such that their chords are opposed to each other via two thin wires (hereinafter may be referred to as "connecting thin wire") 233 and 234. In FIG. 22, centers of circles defining the 180 degrees arc-shaped thin wires 231 and 232 are represented by black circles. The two connecting thin wires 233 and 234 each are configured of a thin wire formed by connecting four thin wires among 90 degrees arc-shaped thin wires 241 to 248 having a radius as a half of the 180 degrees arc-shaped thin wires 231 and 232.

Among the four 90 degrees arc-shaped thin wires 245 to 248 constituting one connecting thin wire 234, the two central 90 degrees arc-shaped thin wires 246 and 247 constitute the 180 degrees arc-shaped thin wire, and the two remaining 90 degrees arc-shaped thin wires 245 and 248 are connected to the central 90 degrees arc-shaped thin wires 246 and 247 such that the median lines form 90 degrees at the end points. Accordingly, the other connecting thin wire 234 forms a Greek alphabet "omega (Ω)"-shaped thin wire. The four 90 degrees arc-shaped thin wires 241 to 244 constituting the other connecting thin wire 233 are connected to take an vertically inverted shape of the one connecting thin wire 234.

The two "Ω"-shaped connecting thin wires 233 and 234 are connected to each other such that the 180 degrees arc-shaped thin wire including the 90 degrees arc-shaped thin wires 242 and 243 contact the 180 degrees arc-shaped thin wire including the 90 degrees arc-shaped thin wires 246 and 247, and the reflected-light distribution pattern 230 forms a thin wire of a shape having two petals interconnected at the bottom (hereinafter may be referred to as "petal-shaped").

The normal lines of the closed thin wires 200, 210, 220, 230 shown in FIG. 20 to FIG. 23 head for all directions, and the thin wires function as the reflected-light distribution pattern.

The reflected-light distribution patterns 200, 210, 220, and 230 formed of the closed thin wires as shown in FIG. 20 to FIG. 23 all have the closed median line and a depression, which is a feature different from that of the reflected-light distribution pattern constituted of circular thin wires. As used herein, "has a depression" means depressed, irregular, and serpentine.

Since the reflected-light distribution patterns 200, 210, 220, and 230 in this embodiment have the depression, the area of the inside of the closed thin wire can be reduced. When the area of the inside of the closed thin wire is made too small, the area of the region including no thin wire becomes large at the outer side of the closed thin wire. However, by appropriately adjusting the area of the region including no thin wire, uneven display can be reduced.

To reduce the inter-wire capacitance, as the area surrounded with the median line in the reflected-light distribution pattern formed of the closed thin wire is larger, the average distance between the detection column wires 2 and the detection row wires 3 advantageously becomes larger. However, when the area of the region including no thin wire within the closed thin wire is large, uneven display easily occurs. When the reflected-light distribution pattern formed of the closed thin wire is contracted while substantially maintaining the average distance between the detection column wires 2 and the detection row wires 3, the thin wire density outside the closed reflected-light distribution pattern lowers, which tends to cause uneven display.

For the area of a rectangular circumscribing the thin wire having the closed median line, given that the area surrounded with the median line is the same, the closed thin wire having a depression can have the larger area than the thin wire having the closed median line including no depression, such as ellipse or circle. Accordingly, by using the closed reflected-light distribution pattern having the depression as in this embodiment, even when the area surrounded with the median line is small, the large average distance between the detection column wires 2 and the detection row wires 3 can be ensured, thereby reducing the inter-wire capacitance.

For example, a square SQ1 circumscribes the reflected-light distribution pattern 200 configured of the four-leaf clover-shaped thin wire in FIG. 20. In the case where a square having the same area circumscribes the four-leaf clover-shaped thin wire constituting the reflected-light distribution pattern 200 and a circular thin wire, an area AR1 surrounded with the median line of the four-leaf clover-shaped thin wire 200 is about 0.68 times of the area surrounded with the median line of the circular thin wire. When the area surrounded with the median line of the four-leaf clover-shaped thin wire 200 is the same as the area surrounded with the median line of the circular thin wire, the length of one side of the square SQ1 circumscribing the four-leaf clover-shaped thin wire 200 is about 1.22 times of the length of one side of the square circumscribing the circular thin wire.

For example, a rectangle RE1 circumscribes the petal-shaped reflected-light distribution pattern 230 in FIG. 23. In the case where a rectangle having the same area circumscribes the petal-shaped thin wire 230 and an elliptic thin wire, an area AR2 surrounded with the median line of the petal-shaped thin wire is about 0.82 times of the area surrounded with the median line of the elliptic thin wire. When the area surrounded with the median line of the petal-shaped thin wire is the same as the area surrounded with the median line of the elliptic thin wire, the petal-shaped thin wire and the elliptic thin wire circumscribing the same rectangle, the length of one side of the rectangle RE1 circumscribing the petal-shaped thin wire is about 1.11 times of the length of a corresponding side of the rectangle circumscribing the elliptic thin wire.

Accordingly, by using the closed reflected-light distribution pattern having the depression as in this embodiment, the area of inner space of the closed reflected-light distribution pattern including no thin wire can be adjusted to reduce uneven display. As a result, a large average distance between the detection column wires 2 and the detection row wires 3 can be ensured to reduce the inter-wire capacitance. Thereby, both of uneven display and inter-wire capacitance can be reduced.

The requirement that the closed reflected-light distribution pattern has the depression will be described in detail. First, the closed reflected-light distribution pattern is selected according to the requirement (a) or (c) for the reflected-light distribution pattern described in First embodiment.

In the case where the median line of the thin wire of the selected reflected-light distribution pattern has an intersection as in the reflected-light distribution pattern 220 configured of the "∞"-shaped thin wire in FIG. 22, it is determined that the selected thin wire has the depression. For example, in the reflected-light distribution pattern 220 in FIG. 22, since there is the intersection point between the linear thin wires 223 and 224 connecting the 270 degrees arc-shaped thin wires 221 and 222 to each other, it is determined that the selected thin wire has the depression.

Also in the case where the median line of the thin wire of the selected reflected-light distribution pattern has a contact point as in the reflected-light distribution pattern 230 configured of the petal-shaped thin wire in FIG. 23, since the contact point is regarded as the intersection when how to follow the median line is changed, it is determined that the selected thin wire has the depression. For example, in the "Ω"-shaped connecting thin wires 233 and 234 connecting to the 180 degrees arc-shaped thin wires 231 and 232 to each other in the reflected-light distribution pattern 230 shown in FIG. 23, since the median lines contact at the end points of the four central 90 degrees arc-shaped thin wires 242, 243, 246, and 247, it is determined that the selected thin wire has the depression.

The presence or absence of the depression is determined according to a following determination standard, in addition to the above-mentioned determination standard. Points l, m, and n are taken on the median line of the selected reflected-light distribution pattern in this order. A point o is taken outside a triangle lmn having the points l, m, and n as apexes and inside the median line of the selected reflected-light distribution pattern. It is required for the points l, m, and n that all of six line segments of line segments lm, mn, and nl as sides of the triangle lmn and line segments lo, mo, and no connecting the apexes to the point o do not cross the median line of the selected reflected-light distribution pattern at any position other than the points l, m, and n.

For the points l, m, and n, o satisfying the above-mentioned requirement, in the case where the point m and the point o are located on the same side with respect to the straight line extended from the line segment nl, when the thin wire constituting the reflected-light distribution pattern into half by drawing the normal line of the median line from the point 1 and the point n on the median line of the reflected-light distribution pattern, the portion including the point m is defined as the depression of the thin wire. That the thin wire has the depression means that such points l, m, n, and o can be taken and there is the depression. The requirement that the point m and the point o are located on the same side with respect to the straight line extended from the line segment nl may be replaced with the requirement that a sum of the area of the triangle lmo and the area of the triangle omn is smaller than the area of the triangle oln.

Whether a point is located inside or outside of the triangle or the median line may be determined based on the general sense. Alternatively, since it can be deemed that the point o to be determined is not located on the sides of the triangle lmn or the median line, a half-line is drawn from the point o, and when the maximum number of the intersection points of the half-line and the sides of the triangle lmn is an even number, the point o is determined to be located outside, and when the maximum number is an odd number, the point o is determined to be located inside. The median line of the closed thin wire can be determined in the same manner. Other determination methods including Cauchy integral theorem may be used.

For example, in the case of the four-leaf clover-shaped thin wire constituting the reflected-light distribution pattern 200 in FIG. 20, the points l, m, and n can be taken on the median line of any of the 90 degrees arc-shaped thin wires 205 to 208 connecting the semi-circular thin wires 201 to 204 at upper left, lower left, upper right, and lower right seen on the plane of FIG. 20, and the point o can be taken at the gravity center of the median line of the thin wire of the reflected-light distribution pattern 200. Therefore, the four-leaf clover-shaped thin wire can be determined to have the depression.

For example, in the case of the windmill-shaped thin wire constituting the reflected-light distribution pattern 210 in FIG. 21, for example, the points l, m, and n can be taken on the median line of a leftward-protruding 90 degrees arc-shaped thin wire 212 of a corrugated thin wire 21a connecting two 90 degrees arc-shaped thin wires 211 and 212 in upper right in FIG. 21, and the point o can be taken at the gravity center of the median line of the reflected-light distribution pattern 210 of the corrugated thin wire. Therefore, the windmill-shaped thin wire can be determined to have the depression.

Figure 24:
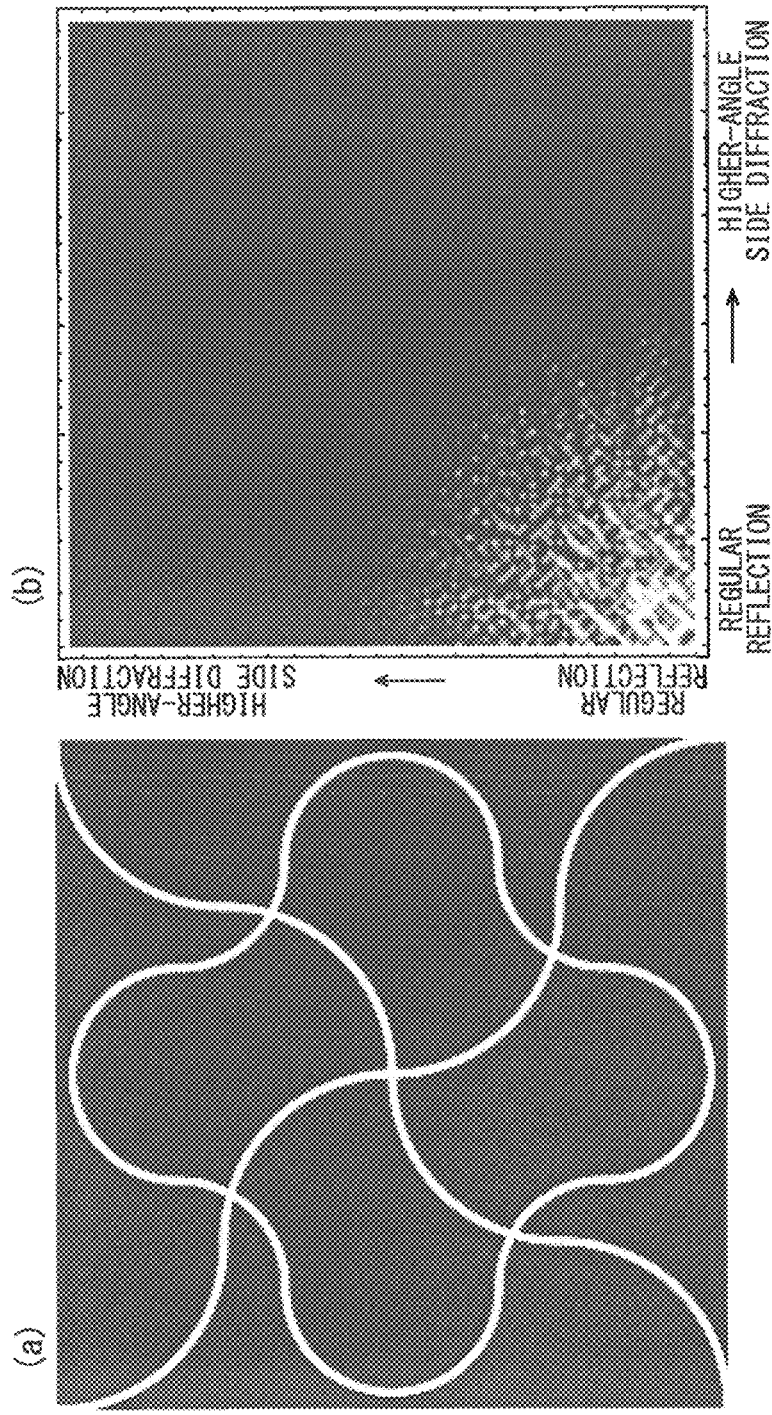
FIG. 24 is a view showing an example of the wiring basic pattern and the Fourier transform thereof in the vicinity of a DC component.

FIG. 24 is a view showing an example of the wiring basic pattern in Fourth embodiment of the present invention, and the vicinity of a DC component of Fourier transform. Part (a) of FIG. 24 is a view showing the example of the simplified wiring basic pattern, and part (b) of FIG. 24 is an enlarged view showing the vicinity of the DC component of Fourier transform in the basic pattern in part (a) of FIG. 24. In part (a) of FIG. 24, a white area represents an area where the thin wire is present and a black area represents an area where the thin wire is absent. To allow the wiring pattern shown in part (a) of FIG. 24, like the wiring patterns shown in parts (a) of FIGS. 14 to 16 and 18, to actually function as wiring of the touch screen, it is need to establish electrical connection with the detection column wire 2 or the detection row wire 3 and provide the crossed portion. In part (a) of FIG. 24, the electrical connection is omitted.

The wiring pattern shown in part (a) of FIG. 24 has the four-leaf clover-shaped thin wire 200 shown in FIG. 20. In the four-leaf clover-shaped thin wire 200, the normal lines head for all directions, and the thin wire functions as the reflected-light distribution pattern. In part (a) of FIG. 24, thin wires obtained by simulating the detection wires 2 and 3 are configured by connecting the 90 degrees arc-shaped thin wires, and extend at substantially ±45 degrees with respect to the horizontal direction seen on the plane of part (a) of FIG. 24, and also function as the reflected-light distribution pattern. In the wiring pattern shown in part (a) of FIG. 24, the linear thin wire is not used. Therefore, as shown in part (b) of FIG. 24, intense reflected light occurring only in the specific direction can be reduced, improving visibility.

FIG. 25 is a view showing another example of the wiring basic pattern in Fourth embodiment of the present invention and the vicinity of a DC component of Fourier transform. Part (a) of FIG. 25 is a view showing the example of the simplified wiring basic pattern, and part (b) of FIG. 25 is an enlarged view showing the vicinity of the DC component of Fourier transform in the basic pattern in part (a) of FIG. 25. In part (a) of FIG. 25, a white area represents an area where the thin wire is present and a black area represents an area where the thin wire is absent. To allow the wiring pattern shown in part (a) of FIG. 25, like the wiring patterns shown in parts (a) of FIGS. 14 to 16, FIG. 18 and FIG. 24, to actually function as wiring of the touch screen, it is need to establish electrical connection with the detection column wire 2 or the detection row wire 3 and provide the crossed portion. In part (a) of FIG. 25, the electrical connection is omitted.

A wiring pattern shown in FIG. 25 has the windmill-shaped thin wire 210 shown in FIG. 21. The normal lines of the windmill-shaped thin wire 210 head for all directions, and the thin wire functions as the reflected-light distribution pattern. In part (a) of FIG. 25, thin wires obtained by simulating the detection wires 2 and 3 are configured by connecting the 90 degrees arc-shaped thin wires, and extend at substantially ±45 degrees with respect to the horizontal direction seen on the plane of part (a) of FIG. 25, and also function as the reflected-light distribution pattern. In the wiring pattern shown in part (a) of FIG. 25, the linear thin wire is not used. Therefore, as shown in part (b) of FIG. 25, intense reflected light occurring only in the specific direction can be reduced, improving visibility.

In the above description, the median line defined in First embodiment is used as a line representing the thin wire. This is due to that, even when the branch thin wire is present, the median line is clearly defined, and the requirements for the reflected-light distribution pattern include the median line. Since the effect described in this embodiment is that the area of inner space of the closed reflected-light distribution pattern including no thin wire can be adjusted, by using the contour facing the inner side of the closed reflected-light distribution pattern as the line representing the thin wire in this embodiment, the presence or absence of the effect can be determined more correctly. Accordingly, the "median line of the selected reflected-light distribution pattern" in the description of the requirement that the thin wire has the depression may be replaced with "contour facing the inner side of the selected reflected-light distribution pattern".

Since the thin wire of smaller width is less viewable, the thin wire desirably has a narrow and uniform width. Accordingly, determination based on the "median line" generally has no problem. However, in the case where the width of the thin wire largely changes, and it is determined that there is no depression based on the median line of the selected reflected-light distribution pattern, but it is determined that there is a depression based on the contour facing the inner side of the selected reflected-light distribution pattern, determination based on the contour has a higher priority and it is determined there is the depression. Such configuration is not preferable, since the width of the thin wire increases and the transmittance of the touch screen lowers. Accordingly, it is desired that the other contour opposed to the contour determined to have the depression have a depression so as to make the width of the thin wire small, resulting in that the median line also has the depression.

As has been described, in this embodiment, the reflected-light distribution pattern having the closed median line including the depression is used. This can prevent a decrease in visibility due to reflected light and uneven display. Further, this can prevent degradation of electrical characteristics such as an increase in the inter-wire capacitance, enabling uniform and highly-sensitive detection of the touch capacitance.

In this embodiment, in the reflected-light distribution pattern, the thin wire including the curved thin wire has the depression and is closed. Thereby, the reflected-light distribution pattern in which the normal lines of the curved portion head for all directions can be realized, and the area of inner space of the closed reflected-light distribution pattern, which includes no thin wire, can be adjusted.

In this embodiment, the reflected-light distribution pattern may be included in at least one of the detection column wire 2 and the detection row wire 3. The reflected-light distribution pattern may be electrically separated, that is, insulated from the detection column wire 2 and the detection row wire 3.

In both cases where the reflected-light distribution pattern in this embodiment is included in at least one of the detection column wire 2 and the detection row wire 3 and where the reflected-light distribution pattern is separated from the detection column wire 2 and the detection row wire 3, when illuminated by spot-like external light such as sunlight or bulb light as described above, reflected light from the reflected-light distribution pattern occurs in all directions. By contrast, according to the conventional art, intense reflected light occurs in the extending direction of the linear wire. Therefore, the possibility that reflected light occurs only in the specific direction can be advantageously eliminated, and the effect of the anti-glare treatment can be obtained.

Fifth Embodiment

In First to Third embodiments, as shown in FIG. 1 and the like, the detection column wires 2 and the detection row wires 3 are arranged one-by-one in a lattice manner. With such configuration, the disposition density of the crossed portions can be increased to improve the detection accuracy of the touch position, but the inter-wire capacitance tends to be large. Especially when the thin wire density is increased to reduce uneven display, the inter-wire capacitance tends to become large. In this embodiment, a method for improving the visibility due to reflected light and increasing the thin wire density while suppressing the inter-wire capacitance will be described.

Figure 27:
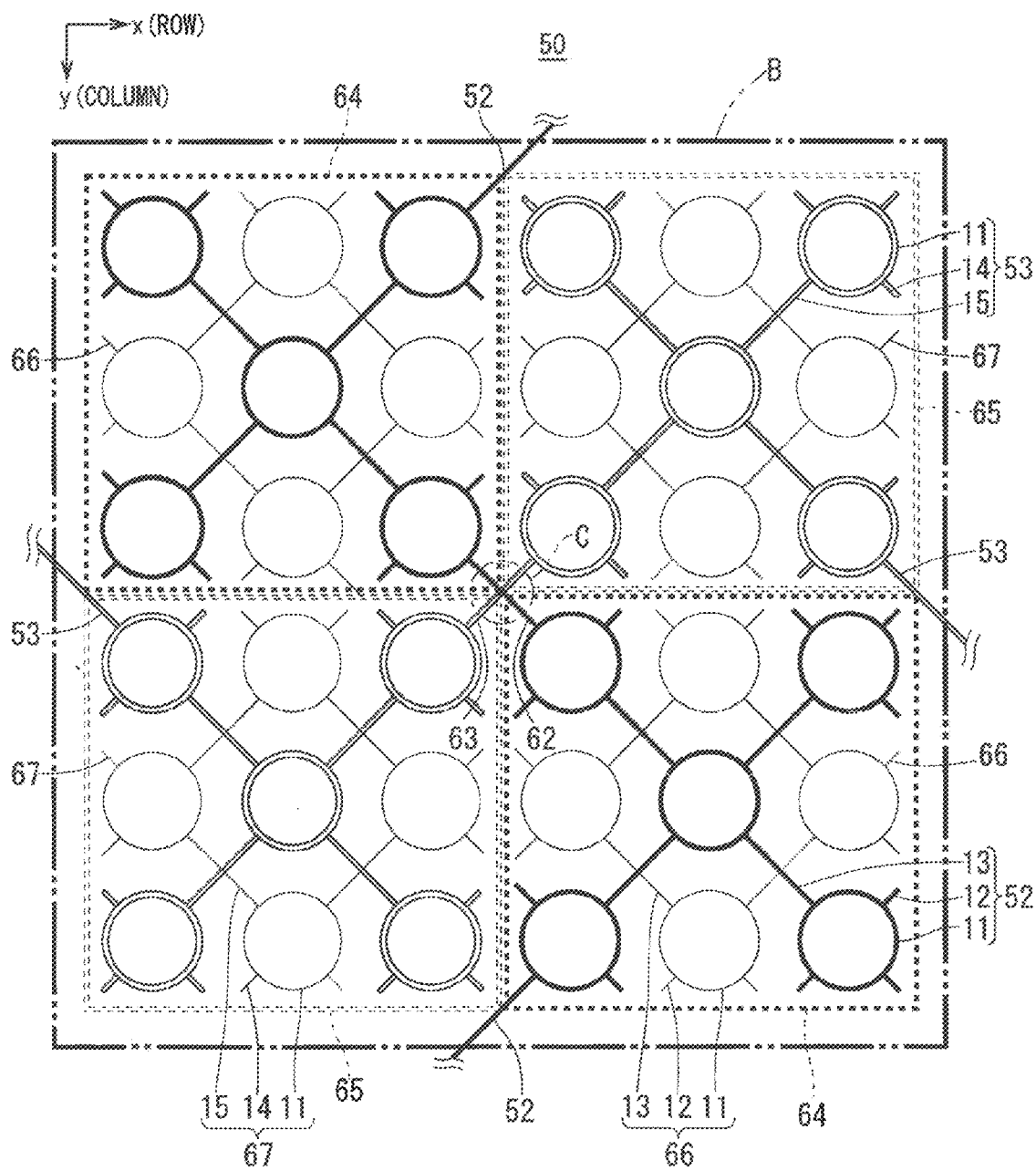
FIG. 27 is a projection view of an enlarged region B in FIG. 26.

FIG. 26 is a projection view showing the wiring pattern of a touch screen 50 in Fifth embodiment of the present invention. In FIG. 26, detection wires 52 and 53 are divided into two regions. FIG. 27 is a projection view showing an enlarged region B in FIG. 26.

In this embodiment, as shown in FIG. 27, the region B of the wiring basic pattern is divided into two regions of a rectangular region (hereinafter referred to as "first region") 64 represented by a thick solid line and a rectangular region (hereinafter referred to as "second region") 65 represented by a double broken line.

The first region 64 does not include the detection row wires 53, and includes the detection column wires 52 and separated thin wires (hereinafter referred to as "first separated thin wires") 66. The second region 65 does not include the detection column wires 52, and includes the detection row wires 53 and separated thin wires (hereinafter referred to as "second separate thin wires") 67. In following description, the first separated thin wires 66 and the second separated thin wires 67 may be collectively referred to as "separated thin wire".

In FIG. 26, for convenience of understanding, the thin wires in the first and second regions 64 and 65 in FIG. 27 are omitted. In this embodiment, the first and second regions 64 and 65 may be configured so as to include the separated thin wires 66 and 67 and include no separated thin wires 66 and 67.

In this embodiment, the first regions 64 are electrically connected to each other via a short thin wire (hereinafter referred to as "first connecting thin wire") 62, and the second regions 65 are electrically connected to each other via a short thin wire (hereinafter referred to as "second connecting thin wire") 63. That is, in this embodiment, the same type of regions are electrically connected to each other to constitute the detection column wires 52 and the detection row wires 53. This can reduce the inter-wire capacitance and increase the thin wire density. In following description, the first connecting thin wire 62 and the second connecting thin wire 63 may be collectively referred to as "connecting thin wire".

In this embodiment, a crossed portion C is formed by allowing the two types connecting thin wires 62 and 63 for electrically connecting the same type of regions to each other at an appropriate density via the insulating layer 18.

In FIG. 26 and FIG. 27, for convenience of understanding, the detection row wires 53 and the second connecting thin wire 63 each are expressed as a double line, but the detection row wires 53 and the connecting thin wires 63 each are actually one thin wire. Although only the first and second connecting thin wires 62 and 63 are shown on the outer side of the first and second regions 64 and 65, for example, if necessary to reduce uneven display, a branch thin wire or a separated thin wire may be disposed.

In FIG. 26, for convenience of understanding, a gap is present between the first region 64 and the second region 65, however, the gap is provided to clarify the drawing, and the first region 64 may be adjacent to the second region 65 as shown in FIG. 27. Thus, also in FIG. 26, a line for separating the first region 64 from the second region 65 without a gap therebetween may be drawn as shown in FIG. 27.

As has been described, in this embodiment, the operational region is divided into two types of regions: the first region 64 and the second region 65, one of the detection column wire 52 and the detection row wire 53, and the separated thin wire as needed are disposed in one region of the two regions, and the other of the detection column wire 52 and the detection row wire 53, and the separated thin wire as needed are disposed in the other region of the two regions.

Accordingly, areas where the detection column wires 2 are close to the detection row wires 3 can be limited to the crossed portions and the boundary of the two regions, resulting in that such areas where the detection column wires 2 are close to the detection row wires 3 are not present in most of the first and second regions 64 and 65. Therefore, the thin wire density can be increased while suppressing the inter-wire capacitance.

In this embodiment, in addition to the detection wires 52 and 53, the separated thin wires 66 and 67 are provided. This can further increase the thin wire density. Although not shown in FIG. 27, first separated thin wires 66 are electrically insulated from the detection column wires 52 via the insulating layer 18. Similarly, the second separated thin wires 67 are electrically insulated from the detection row wires 53 via the insulating layer 18.

The wiring pattern in the first and second regions 64 and 65 has, as shown in FIG. 27, the reflected-light distribution pattern 11. In this embodiment, the circular thin wires 11 as the reflected-light distribution pattern are connected to each other via the linear thin wires 13 and 15. To reduce uneven display, the thin wires 12 and 14 that extend from the circular thin wire 11 in the form of a straight line and have unconnected end points are provided. These linear thin wires 12 to 15 may be, as shown in FIG. 17, curved thin wires. By using such curved thin wires, no linear thin wire is used in the operational region, further improving the visibility due to reflected light.

As described above, since the touch screen 50 in this embodiment has the reflected-light distribution pattern 11, when the touch screen is illuminated by spot-like external light such as sunlight or bulb light, reflected light from the reflected-light distribution pattern occurs in all directions. By contrast, according to the conventional art, intense reflected light occurs in the extending direction of the linear wire. Thus, the possibility that reflected light occurs only in the specific direction can be eliminated and further, the effect of the anti-glare treatment can be obtained. As a result, the touch screen 50 having outstanding visibility can be realized.

In this embodiment, the operational region is divided into two types of regions: the first region 64 and the second region 65, one of the detection column wire 52 and the detection row wire 53, and the separated thin wire as needed are disposed in one region of the two regions, and the other of the detection column wire 52 and the detection row wire 53, and the separated thin wire as needed are disposed in the other region of the two regions. Thus, the touch screen 50 that has a small inter-wire capacitance, can reduce wiring delay and improve responsiveness, and has excellent electrical characteristics can be realized.

In First to Fifth embodiments, as shown in FIG. 3, the detection column wires 2 and the detection row wires 3 are provided on one surface of the transparent base 19, and the insulating layer 18 is interposed between the detection column wires 2 and the detection row wires 3. The present invention is not limited to this, and for example, as shown in FIG. 28, the transparent base 19 may also function as the insulating layer 18.

Figure 28:
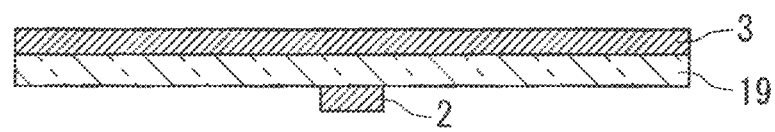
FIG. 28 is a sectional view showing another example of a layer configuration of the touch screen.

FIG. 28 is a sectional view showing another example of layer structure of the touch screen. In the example shown in FIG. 28, the detection row wires 3 are provided on one surface of the transparent base 19, and the detection column wires 2 are provided on the other surface of the transparent base 19. The transparent base 19 is made of a transparent dielectric material and thus, can also function as the insulating layer 18. In this case, a step of forming the insulating layer 18 can be omitted.

Sixth Embodiment

Figure 29:
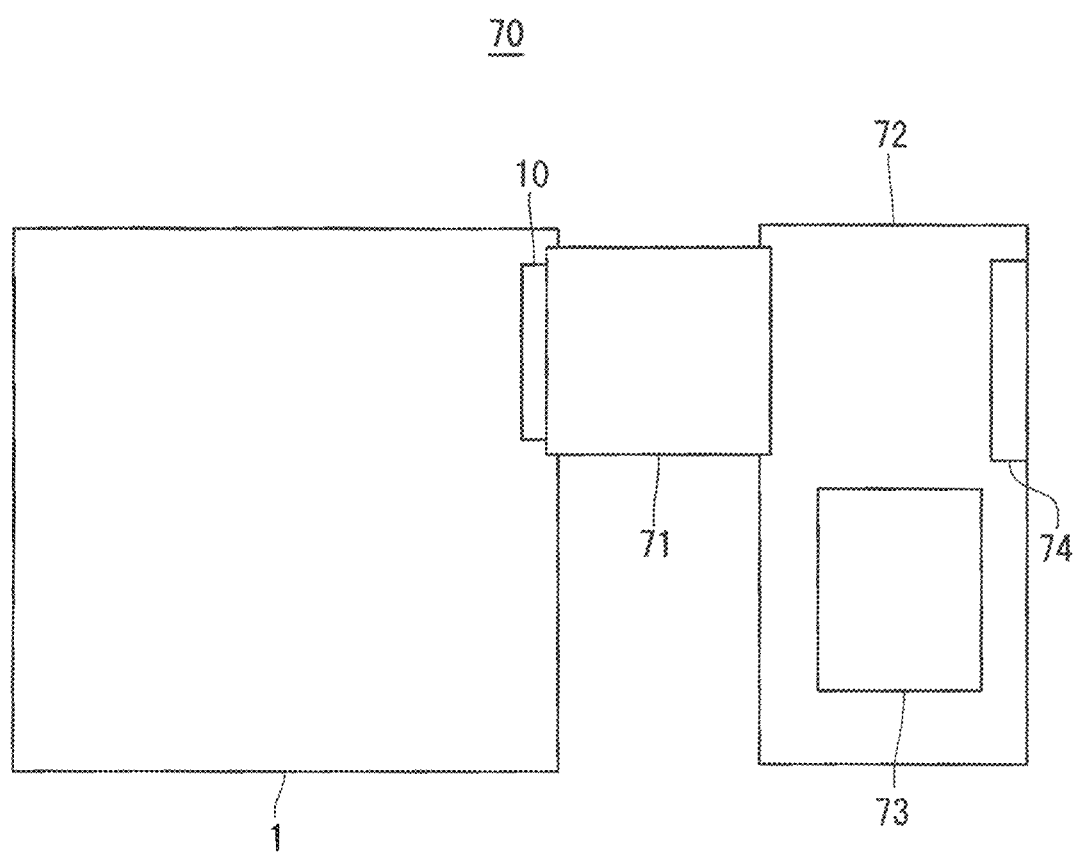
FIG. 29 is a projection view schematically showing a configuration of a touch panel 70.

FIG. 29 is a plan view schematically showing configuration of a touch panel 70. The touch panel 70 includes the touch screen 1 in First embodiment as shown in FIG. 1, a flexible printed circuit board 71, and a controller board 72.

Each terminal of the flexible printed circuit board 71 is mounted to the corresponding terminal 10 of the touch screen 1 by using an anisotropic conductive film (abbreviated as ACF) or the like. The ends of the detection wires 2 and 3 of the touch screen 1 are electrically connected to the controller board 72 via the flexible printed circuit board 71, such that the touch screen 1 functions as a main constituent of the touch panel 70.

The controller board 72 is provided with a detection processing circuit 73. The detection processing circuit 73 detects the touch capacitance that is a capacitance formed between the column-direction bundle wires 6 and the row-direction bundle wires 7, and the indicator, which is caused by application of a signal voltage, and calculates the touch position of the indicator on the touch screen 1 on the basis of a detection result. The detection processing circuit 73 corresponds to a touch position detection circuit.

The detection processing circuit 73 can employ a projected capacitive detection logic. The controller board 72 includes an external connection terminal for outputting a calculation result of touch coordinates from the detection processing circuit 73 to an external processor.

As described above, the touch panel 70 in this embodiment includes the touch screen 1 in First embodiment. As described above, the touch screen 1 has outstanding visibility, and can increase the wiring density without increasing the inter-wire capacitance. By using such touch screen 1, it is possible to provide the projected capacitive touch panel 70 that can be grown in size without lowering the sensitivity of detecting the touch capacitance.

In this embodiment, the touch panel 70 includes the touch screen 1 in First embodiment. However, the touch panel may include any of the touch screens 30, 40, and 50 in Second to Fifth embodiments in place of the touch screen 1. The detection processing circuit 73 on the controller board 72 may be directly mounted on the transparent base 19, not on the controller board 72.

Seventh Embodiment

A display device in accordance with Seventh embodiment of the present invention includes the touch panel 70 shown in FIG. 29 and a display element. The display element is, for example, a liquid crystal display (LCD), a plasma display panel (abbreviated as PDP), or an organic light-emitting display (abbreviated as OLED). The touch panel 70 is disposed closer to the user than the display screen of the display device. By providing the touch panel 70 on the user side of the display screen of the display device in this manner, a display device provided with the touch panel having a function of detecting the touch position according to the user's instruction can be realized.

The display device in this embodiment, as described above, includes the touch panel 70 having the touch screen 1 of high visibility. Therefore, the display device provided with the projected capacitive touch panel having high visibility can be provided.

Eighth Embodiment

An electronic device in accordance with Eighth embodiment of the present invention includes the touch panel 70 shown in FIG. 29 and a signal processing element that is an electronic element. The signal processing element receives an output from an external connection terminal 74 of the touch panel 70, and outputs the same as a digital signal. By connecting the signal processing element to the touch panel 70, an electronic device having the touch position detection function, such as a digitizer that outputs the touch position detected according to the user's instruction to an external signal processer such as a computer can be realized.

The signal processing element may be built in the controller board 72. The signal processing element can have an output function meeting the Standards of the bus such as a USB (Universal Serial Bus) to realize a versatile electronic device having the touch position detection function.

As described above, in this embodiment, the electronic device includes the above-mentioned touch screen 1 having outstanding visibility. Therefore, the electronic device that has outstanding visibility and has the projected-capacitive touch position detection function can be provided.

The above-mentioned embodiments can be freely combined with each other within the scope of the present invention, and any constituents of the above-mentioned embodiments can be appropriately modified or omitted.

Although the present invention has been described in detail, the above description is only illustrative in all aspects, and the present invention is not limited to this. It is to be understood that a number of unillustrated modifications can fall within the scope of the present invention.

DESCRIPTION OF REFERENCE NUMERALS

1, 20, 21, 30, 40, 50: touch screen, 2, 22, 32, 42, 52: detection column wire, 3, 23, 33, 43, 53: detection row wire, 4: column connecting wire, 5: row connecting wire, 6: column-direction bundle wire, 7: row-direction bundle wire, 8, 9: lead wire, 10: terminal, 11, 100, 110, 120, 130, 140, 150, 160, 170, 200, 210, 220, 230: reflected-light distribution pattern, 18: insulating layer, 19: transparent base, 70: touch panel.

The invention claimed is:

1. A touch screen comprising:
   a plurality of column wires extending in a predetermined column direction, the column wires being arranged at intervals in a row direction crossing said column direction;
   a plurality of row wires extending in said row direction, the row wires being arranged at intervals in said column direction; and
   a transparent base made of a translucent material, the transparent base being provided with said column wires and said row wires which are electrically separated from each other and crossing each other in a three-dimensional way, wherein
   said column wires and said row wires are made of a conductive material having light reflectivity,
   a predetermined plural number of said column wires are electrically connected to form a plurality of column-direction bundle wires,
   a predetermined plural number of said row wires are electrically connected to form a plurality of row-direction bundle wires,
   said transparent base is provided with a reflected-light distribution pattern made of a light reflective material, said reflected-light distribution pattern includes a curved portion shaped in a curved manner when viewed in a direction vertical to a surface of said transparent base facing a user, and is disposed such that normal lines of said curved portion head for all directions, and
   said curved portion of said reflected-light distribution pattern includes at least one of said row-direction bundle wires and said column-direction bundle wires such that said curved portion of said reflected-light distribution pattern and said at least one of said row-direction bundle wires and said column-direction bundle wires are formed in a single layer.

2. The touch screen according to claim 1, wherein said reflected-light distribution pattern is configured of a composite curve formed of a plurality of said curved portions having different curvature radii, and normal lines of each of said curved portions head for all directions.

3. The touch screen according to claim 1, wherein said reflected-light distribution pattern is included in at least either of said column wires and said row wires.

4. The touch screen according to claim 1, wherein said reflected-light distribution pattern is insulated from at least either of said column wires and said row wires.

5. The touch screen according to claim 1, wherein said transparent base is provided with a plurality of said reflected-light distribution patterns, and
   said plurality of reflected-light distribution patterns are disposed so as not to form a parallel section between said reflected-light distribution patterns adjacent to each other.

6. The touch screen according to claim 1, comprising:
   a first region that does not include said row wires and includes said column wires and a second region that does not include said column wires and includes said row wires, when viewed in the direction vertical to the surface of said transparent base facing the user.

7. The touch screen according to claim 1, wherein in said reflected-light distribution pattern, a thin wire including said curved portion is closed.

8. The touch screen according to claim 7, wherein said reflected-light distribution pattern is formed of a closed thin wire, and has a depression when viewed in the direction vertical to the surface of said transparent base facing the user.

9. A touch panel comprising:
   the touch screen according to claim 1; and
   a touch position detection circuit for detecting a position on said touch screen, the position being indicated by an indicator on the basis of a capacitance formed between said indicator, and said column wires and said row wires of said touch screen,
   wherein said touch position detection circuit and said touch screen are different elements.

10. A display device comprising:
    the touch panel according to claim 9; and
    a display element,
    wherein said touch panel is disposed closer to the user than said display element.

11. An electronic device comprising:
    the touch panel according to claim 9; and
    an electronic element for processing an output of said touch position detection circuit of said touch panel as an input signal.

* * * * *